(12) United States Patent
Lee et al.

(10) Patent No.: US 8,790,750 B2
(45) Date of Patent: Jul. 29, 2014

(54) THIN FILM DEPOSITION APPARATUS

(75) Inventors: Jung-Min Lee, Yongin (KR); Choong-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 816 days.

(21) Appl. No.: 12/820,270

(22) Filed: Jun. 22, 2010

(65) Prior Publication Data
US 2010/0330265 A1 Dec. 30, 2010

(30) Foreign Application Priority Data

Jun. 24, 2009 (KR) ........................ 10-2009-0056529

(51) Int. Cl.
*C23C 16/44* (2006.01)

(52) U.S. Cl.
USPC ........................................ 427/248.1; 118/715

(58) Field of Classification Search
None
See application file for complete search history.

(56) References Cited

U.S. PATENT DOCUMENTS

| | | | |
|---|---|---|---|
| 4,416,217 A | 11/1983 | Nakamura et al. | |
| 4,687,939 A | 8/1987 | Miyauchi et al. | |
| 4,901,667 A | 2/1990 | Suzuki et al. | |
| 5,742,129 A | 4/1998 | Nagayama et al. | |
| 6,045,671 A | 4/2000 | Wu et al. | |
| 6,091,195 A | 7/2000 | Forrest et al. | |
| 6,274,198 B1 | 8/2001 | Dautartas | |
| 6,280,821 B1 * | 8/2001 | Kadunce et al. | 428/157 |
| 6,371,451 B1 | 4/2002 | Choi | |
| 6,417,034 B2 | 7/2002 | Kitazume et al. | |
| 6,579,422 B1 | 6/2003 | Kakinuma | |
| 6,589,673 B1 | 7/2003 | Kido et al. | |
| 6,699,324 B1 | 3/2004 | Berdin et al. | |
| 6,749,906 B2 | 6/2004 | Van Slyke | |
| 6,878,209 B2 | 4/2005 | Himeshima et al. | |
| 6,946,783 B2 | 9/2005 | Kim | |
| 7,006,202 B2 | 2/2006 | Byun et al. | |

(Continued)

FOREIGN PATENT DOCUMENTS

| | | |
|---|---|---|
| EP | 1 413 644 | 4/2004 |
| EP | 1 418 250 | 5/2004 |

(Continued)

OTHER PUBLICATIONS

KIPO Office action dated Sep. 1, 2012, for Korean Patent application 10-2010-0010136, (5 pages).

(Continued)

*Primary Examiner* — Joseph Miller, Jr.
(74) *Attorney, Agent, or Firm* — Christie, Parker & Hale, LLP

(57) ABSTRACT

A thin film deposition apparatus that can be simply applied to manufacture a thin film on a large substrate on a mass scale and that improves manufacturing yield includes a deposition source; a first nozzle disposed at a side of the deposition source and including first slits arranged in a first direction; a second nozzle assembly disposed opposite to the deposition source and including strings arranged in the first direction; and a barrier wall assembly including barrier walls disposed between the first nozzle and the second nozzle assembly to partition a space between the first nozzle and the second nozzle assembly into a plurality of sub-deposition spaces. The second nozzle assembly is movable relative to the target along a plane parallel to a surface of the target, or the target is movable relative to the second nozzle along the plane.

31 Claims, 16 Drawing Sheets

(56) References Cited

U.S. PATENT DOCUMENTS

| | | |
|---|---|---|
| RE39,024 E | 3/2006 | Takahashi |
| 7,078,070 B2 | 7/2006 | Peng |
| 8,188,476 B2 | 5/2012 | Takagi et al. |
| 8,193,011 B2 | 6/2012 | Kang et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2003/0021886 A1 | 1/2003 | Baele |
| 2003/0101932 A1 | 6/2003 | Kang |
| 2003/0101937 A1 | 6/2003 | Van Slyke et al. |
| 2003/0118950 A1 | 6/2003 | Chao et al. |
| 2003/0168013 A1 | 9/2003 | Freeman et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0115338 A1 | 6/2004 | Yoneda |
| 2004/0115342 A1 | 6/2004 | Shigemura |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2005/0016461 A1* | 1/2005 | Klug et al. ............ 118/726 |
| 2005/0031836 A1 | 2/2005 | Hirai |
| 2005/0037136 A1 | 2/2005 | Yamamoto |
| 2005/0072359 A1 | 4/2005 | Kim |
| 2005/0072361 A1 | 4/2005 | Yang et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0090705 A1 | 5/2006 | Kim |
| 2006/0110544 A1* | 5/2006 | Kim et al. ............ 427/458 |
| 2006/0113907 A1 | 6/2006 | Im et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0269671 A1 | 11/2006 | Kim et al. |
| 2006/0272572 A1 | 12/2006 | Uematsu et al. |
| 2006/0280588 A1 | 12/2006 | Blonigan et al. |
| 2007/0009552 A1 | 1/2007 | Whitehead et al. |
| 2007/0017445 A1 | 1/2007 | Takehara et al. |
| 2007/0022955 A1 | 2/2007 | Bender et al. |
| 2007/0054044 A1 | 3/2007 | Shimosaki et al. |
| 2007/0077358 A1 | 4/2007 | Jeong et al. |
| 2007/0148337 A1 | 6/2007 | Nichols et al. |
| 2007/0157879 A1 | 7/2007 | Yotsuya |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0231460 A1 | 10/2007 | Ukigaya |
| 2008/0018236 A1 | 1/2008 | Arai et al. |
| 2008/0100201 A1 | 5/2008 | Wei et al. |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1* | 6/2008 | Guo et al. ............ 427/75 |
| 2008/0174235 A1 | 7/2008 | Kim et al. |
| 2008/0216741 A1 | 9/2008 | Ling et al. |
| 2008/0238294 A1 | 10/2008 | Xu et al. |
| 2009/0017192 A1 | 1/2009 | Matsuura |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1* | 11/2009 | Takagi et al. ............ 118/724 |
| 2009/0279173 A1 | 11/2009 | Chui et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0165454 A1 | 7/2010 | Suetsugu et al. |
| 2010/0192856 A1 | 8/2010 | Sung et al. |
| 2010/0196607 A1 | 8/2010 | Carlson et al. |
| 2010/0271602 A1 | 10/2010 | Hanazaki |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0220019 A1 | 9/2011 | Lee et al. |
| 2012/0009328 A1 | 1/2012 | Ryu et al. |
| 2012/0145077 A1 | 6/2012 | Chang et al. |
| 2012/0313251 A1 | 12/2012 | Kato |

FOREIGN PATENT DOCUMENTS

| | | |
|---|---|---|
| EP | 1 518 940 | 3/2005 |
| JP | 4-272170 | 9/1992 |
| JP | 2000-68054 | 3/2000 |
| JP | 2001-52862 | 2/2001 |
| JP | 2001-93667 | 4/2001 |
| JP | 2002-075638 | 3/2002 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2003-321767 | 11/2003 |
| JP | 2004-43898 | 2/2004 |
| JP | 2004-103269 | 4/2004 |
| JP | 2004-103341 | 4/2004 |
| JP | 2004-169169 | 6/2004 |
| JP | 2004-199919 | 7/2004 |
| JP | 2004-349101 | 12/2004 |
| JP | 2005-44592 | 2/2005 |
| JP | 2005-122980 | 5/2005 |
| JP | 2005-174843 | 6/2005 |
| JP | 2005-235568 | 9/2005 |
| JP | 2005-293968 | 10/2005 |
| JP | 2005-296737 | 10/2005 |
| JP | 2006-210038 | 8/2006 |
| JP | 2006-275433 | 10/2006 |
| JP | 2007-47293 | 2/2007 |
| JP | 2007-186740 | 7/2007 |
| JP | 2008-108628 | 5/2008 |
| JP | 2008-121098 | 5/2008 |
| JP | 2008-521165 | 6/2008 |
| JP | 2009-19243 | 1/2009 |

(56) References Cited

FOREIGN PATENT DOCUMENTS

| | | |
|---|---|---|
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-2003-0001745 | 1/2003 |
| KR | 10-2003-0046090 | 6/2003 |
| KR | 2003-0069684 | 8/2003 |
| KR | 10-2003-0091947 | 12/2003 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2005-0062853 | 6/2005 |
| KR | 10-2006-0008602 | 1/2006 |
| KR | 10-2006-0018745 | 3/2006 |
| KR | 2006-0020050 | 3/2006 |
| KR | 10-2006-0056706 | 5/2006 |
| KR | 10-2006-0058459 | 5/2006 |
| KR | 2006-0049050 | 5/2006 |
| KR | 10-2006-0065978 | 6/2006 |
| KR | 10-2006-0073367 | 6/2006 |
| KR | 2006-0059068 | 6/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104675 | 10/2006 |
| KR | 10-2006-0109627 | 10/2006 |
| KR | 10-0635903 B1 | 10/2006 |
| KR | 10-0645719 B1 | 11/2006 |
| KR | 10-0687007 | 2/2007 |
| KR | 10-2007-0025164 | 3/2007 |
| KR | 10-0696547 | 3/2007 |
| KR | 10-0697663 B1 | 3/2007 |
| KR | 10-2007-0035796 | 4/2007 |
| KR | 10-2007-0050793 | 5/2007 |
| KR | 10-0723627 | 5/2007 |
| KR | 10-0739309 B1 | 7/2007 |
| KR | 10-2007-0080635 | 8/2007 |
| KR | 10-2007-0105595 | 10/2007 |
| KR | 10-0770653 | 10/2007 |
| KR | 10-2007-0112668 | 11/2007 |
| KR | 10-2008-0001184 | 1/2008 |
| KR | 10-0800125 | 1/2008 |
| KR | 10-0823508 | 4/2008 |
| KR | 10-2008-0044775 | 5/2008 |
| KR | 10-2008-0048653 | 6/2008 |
| KR | 10-2008-0060400 | 7/2008 |
| KR | 10-2008-0061132 | 7/2008 |
| KR | 10-2008-0062212 | 7/2008 |
| KR | 10-2008-0109559 | 12/2008 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-0908232 B1 | 7/2009 |
| KR | 10-2009-0093161 | 9/2009 |
| KR | 10-2010-0000128 | 1/2010 |
| KR | 10-2010-0000129 | 1/2010 |
| KR | 10-2010-0026655 | 3/2010 |
| KR | 10-2010-0090070 | 8/2010 |
| KR | 10-2011-0101767 | 9/2011 |
| WO | WO 99/25894 A1 | 5/1999 |

OTHER PUBLICATIONS

KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
Japanese Office action dated Sep. 4, 2012, for Japanese Patent application 2010-152846, (4 pages).
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, May 21, 2010, Choong-Ho Lee et al., Samsung Mobile Display Co., Ltd.
U.S. Appl. No. 13/014,225, Jan. 26, 2011, Jong-Won Hong et al., Samsung Mobile Display Co., Ltd.
U.S. Appl. No. 12/797,858, Jun. 10, 2010, Choong-Ho Lee et al., Samsung Mobile Display Co., Ltd.
U.S. Appl. No. 12/836,760, Jul. 15, 2010, Jong-Neon Kim, et al., Samsung Mobile Display Co., Ltd.
U.S. Appl. No. 12/784,804, May 21, 2010, Choong-Ho Lee, et al., Samsung Mobile Display Co., Ltd.
U.S. Appl. No. 12/849,193, Aug. 3, 2010, Ji-Sook Oh et al., Samsung Mobile Display Co., Ltd.
U.S. Appl. No. 12/979,193, Dec. 28, 2010, Hyun Sook Park et al., Samsung Mobile Display Co., Ltd.
U.S. Appl. No. 12/820,355, Jun. 22, 2010, Yong-Sup Choi et al., Samsung Mobile Display Co., Ltd.
U.S. Appl. No. 12/950,361, Nov. 19, 2010, Choong-Ho Lee, et al., Samsung Mobile Display Co., Ltd.
U.S. Appl. No. 12/795,896, Jun. 8, 2010, Jung-Min Lee, et al., Samsung Mobile Display Co., Ltd.
U.S. Appl. No. 12/856,942, Aug. 16, 2010, Yun-Mi Lee et al., Samsung Mobile Display Co., Ltd.
U.S. Appl. No. 12/814,816, Jun. 14, 2010, Jung-Min Lee et al., Samsung Mobile Display Co., Ltd.
U.S. Appl. No. 12/868,099, Aug. 25, 2010, Hee-Cheol Kang, et al., Samsung Mobile Display Co., Ltd.
U.S. Appl. No. 12/862,153, Aug. 24, 2010, Hee-Cheol Kang, et al., Samsung Mobile Display Co., Ltd.
U.S. Appl. No. 12/869,830, Aug. 27, 2010, Chang-Mog Jo, et al., Samsung Mobile Display Co., Ltd.
U.S. Appl. No. 12/849,092, Aug. 3, 2010, Choong-Ho Lee et al., Samsung Mobile Display Co., Ltd.
U.S. Appl. No. 12/873,556, Sep. 1, 2010, Young-Mook Choi, et al., Samsung Mobile Display Co., Ltd.
U.S. Appl. No. 12/873,689, Sep. 1, 2010, Young-Mook Choi, et al., Samsung Mobile Display Co., Ltd.
U.S. Appl. No. 12/815,673, Jun. 15, 2010, Jung-Min Lee, Samsung Mobile Display Co., Ltd.
U.S. Appl. No. 12/794,093, Jun. 4, 2010, Jung-Min Lee et al., Samsung Mobile Display Co., Ltd.
U.S. Appl. No. 12/862,125, Aug. 24, 2010, Jae-Kwang Ryu et al., Samsung Mobile Display Co., Ltd.
U.S. Appl. No. 12/795,001, Jun. 7, 2010, Choong-Ho Lee et al., Samsung Mobile Display Co., Ltd.
U.S. Appl. No. 12/813,786, Jun. 11, 2010, Choong-Ho Lee et al., Samsung Mobile Display Co., Ltd.
U.S. Appl. No. 12/907,396, Oct. 19, 2010, Yong-Sup Choi, et al., Samsung Mobile Display Co., Ltd.
U.S. Appl. No. 12/987,569, Jan. 10, 2011, Yun-Mi Lee et al., Samsung Mobile Display Co., Ltd.
U.S. Appl. No. 12/984,289, Jan. 4, 2011, Jung-Yeong Kim et al., Samsung Mobile Display Co., Ltd.
English-language abstract of Korean Publication No. 10-2005-0045619.

(56) References Cited

OTHER PUBLICATIONS

U.S. Appl. No. 13/031,756, Feb. 22, 2011, Yong Sup Choi et al., Samsung Mobile Display Co., Ltd.
KIPO Registration Determination Certificate dated Jul. 20, 2012, for Korean priority Patent application 10-2010-0003545, (5 pages).
KIPO Registration Determination Certificate dated Apr. 30, 2012, for Korean priority Patent application 10-2010-0066992, (5 pages).
Japanese Office action dated Aug. 21, 2012, for Japanese Patent application 2010-145075, (5 pages).
KIPO Registration Determination Certificate dated Jan. 13, 2012, for Korean patent application 10-2009-0056529, 5 pages.
KIPO Office action dated Feb. 1, 2012, for Korean patent application 10-2010-0031848, 4 pages.
KIPO Registration Determination Certificate dated Sep. 28, 2011, for Korean Patent application 10-2009-0052357, 5 pages.
KIPO Registration Determination Certificate dated Nov. 25, 2011, for Korean Patent application 10-2010-0014277, 5 pages.
KIPO Office action dated Feb. 1, 2012, for Korean patent application 10-2010-0011196, 4 pages.

\* cited by examiner

THIN FILM DEPOSITION APPARATUS

CROSS-REFERENCE TO RELATED APPLICATION

This application claims the benefit of Korean Patent Application No. 10-2009-0056529, filed Jun. 24, 2009 in the Korean Intellectual Property Office, the disclosure of which is incorporated herein by reference.

BACKGROUND

1. Field

One or more aspects of the present invention relate to a thin film deposition apparatus, and more particularly, to an apparatus for depositing a thin film on a substrate.

2. Description of the Related Art

Organic light-emitting display devices have a larger viewing angle, better contrast characteristics, and a faster response rate than other display devices. Thus, organic light-emitting display devices have drawn attention as a next-generation display device.

In general, organic light-emitting display devices have a stacked structure including an anode, a cathode, and an emission layer interposed between the anode and the cathode. Organic light-emitting display devices display images in color when holes and electrons, injected respectively from the anode and the cathode, recombine in the emission layer and thus light is emitted. However, it is difficult to achieve high light-emission efficiency with such a structure. Thus, intermediate layers are optionally additionally interposed between the emission layer and each of the electrodes. Examples of intermediate layers include an electron injection layer, an electron transport layer, a hole transport layer, a hole injection layer, etc.

The organic light-emitting display device includes intermediate layers and including an emission layer disposed between a first electrode and a second electrode that are arranged opposite to each other. The electrodes and the intermediate layers may be formed by using various methods, one of which is a deposition method. When an organic light-emitting display device is manufactured using the deposition method, a fine metal mask (FMM) is used. The FMM has the same pattern as a thin film to be formed and is disposed to closely contact a substrate. A thin film material is then deposited over the FMM so as to form the thin film having the desired pattern.

SUMMARY

One or more aspects of the present invention provide a thin film deposition apparatus that can be easily manufactured, that can be simply applied to manufacture a thin film on a large substrate on a mass scale, that improves manufacturing yield and deposition efficiency, and that allows deposited materials to be reused.

According to an aspect of the present invention, there is provided a thin film deposition apparatus for forming a thin film on a target, the apparatus including a deposition source; a first nozzle disposed at a side of the deposition source and including a plurality of first slits arranged in a first direction; a second nozzle assembly disposed opposite to the deposition source and having a plurality of strings arranged in the first direction; and a barrier wall assembly including a plurality of barrier walls disposed between the first nozzle and the second nozzle assembly in the first direction to partition a space between the first nozzle and the second nozzle assembly into a plurality of sub-deposition spaces. The deposition source, the first nozzle, the second nozzle assembly, and the barrier wall assembly are movable relative to the target along a plane parallel to a surface of the target, or the target is movable relative to the deposition source, the first nozzle, the second nozzle, and the barrier wall assembly along the plane.

According to an aspect of the present invention, the second nozzle assembly may be disposed apart from the target by a predetermined distance.

According to an aspect of the present invention, a deposition material discharged from the deposition source may pass between each adjacent strings of the plurality of strings.

According to an aspect of the present invention, the second nozzle assembly may include two second nozzle frames disposed to face each other; and the plurality of strings disposed between the two second nozzle frames.

According to an aspect of the present invention, the second nozzle assembly may further include an elastic unit disposed between the two second nozzle frames, the elastic unit for applying a predetermined elastic force to the plurality of strings to maintain the plurality of strings tensioned.

According to an aspect of the present invention, the elastic unit may include a tension spring.

According to an aspect of the present invention, each of the two second nozzle frames may include a plurality of string accommodating grooves in which the plurality of strings are accommodated and that have cut ends having substantially the same shape as cut ends of the plurality of strings, respectively.

According to an aspect of the present invention, the second nozzle assembly may further include a plurality of fixing units combined with at least one of ends of the plurality of strings to prevent the plurality of strings from being separated from the second nozzle frames.

According to an aspect of the present invention, each of the second nozzle frames may include a plurality of string through-holes into which the plurality of strings are inserted to pass through the plurality of string through-holes.

According to an aspect of the present invention, each of the plurality of strings may be inserted to pass through one of the plurality of string through-holes, is bent and may be then inserted again to pass through an adjacent string through-hole from among the plurality of string through-holes.

According to an aspect of the present invention, the second nozzle assembly may further include two winding units disposed at both ends of the two second nozzle frames facing each other, respectively, herein the plurality of strings are unwound from one of the winding units and are wound around the other winding unit.

According to an aspect of the present invention, the two winding units may rotate in the same direction to move the plurality of strings.

According to an aspect of the present invention, each of the second nozzle frames may include an upper second nozzle frame and a lower second nozzle frame.

According to an aspect of the present invention, the upper second nozzle frame and the lower second nozzle frame may include a plurality of string through-holes through which the plurality of strings pass.

According to an aspect of the present invention, the plurality of strings may be alternately inserted from the upper second nozzle frame into the lower second frame and from the lower second nozzle frame into the upper second nozzle frame so as to pass through the plurality of string through-holes.

According to an aspect of the present invention, the thin film deposition apparatus may further include a plurality of tightening units disposed at both ends of the upper and lower second nozzle frames, wherein the plurality of tightening units include pairs of bolts and nuts.

According to an aspect of the present invention, the plurality of strings may include glass fiber.

According to an aspect of the present invention, the plurality of strings may have round cut ends having a predetermined curvature.

According to an aspect of the present invention, the plurality of strings may include at least one material selected from the group consisting of boron fiber, KEVLAR fiber, and carbon fiber.

According to an aspect of the present invention, each of the barrier walls may extend in a second direction that is substantially perpendicular to the first direction, so as to partition a space between the first nozzle and the second nozzle assembly into a plurality of sub-deposition spaces.

According to an aspect of the present invention, the plurality of barrier walls may be arranged at equal intervals.

According to an aspect of the present invention, the barrier walls may be disposed apart from the second nozzle assembly by a predetermined distance.

According to an aspect of the present invention, the barrier wall assembly may be disposed to be detachable from the thin film deposition apparatus.

According to an aspect of the present invention, each of the barrier plate assemblies may include a first barrier wall assembly including a plurality of first barrier walls; and a second barrier wall assembly including a plurality of second barrier walls.

According to an aspect of the present invention, each of the first barrier walls and each of the second barrier walls may extend in a second direction that is substantially perpendicular to the first direction, so as to partition a space between the first nozzle and the second nozzle assembly into a plurality of sub-deposition spaces.

According to an aspect of the present invention, the first barrier walls may be arranged to respectively correspond to the second barrier walls.

According to an aspect of the present invention, each pair of the corresponding first and second barrier walls may be disposed on substantially the same plane to correspond to each other.

According to an aspect of the present invention, the deposition material may be deposited on the target while the deposition source, the first nozzle, the second nozzle assembly, and the barrier wall assembly may be moved relative to the target or while the target is moved relative to the deposition source, the first nozzle, the second nozzle assembly, and the barrier wall assembly.

According to an aspect of the present invention, the deposition source, the first nozzle, the second nozzle assembly, and the barrier wall assembly may be moved relative to the target along a plane parallel to a surface of the target or the target is moved relative to the deposition source, the first nozzle, the second nozzle assembly, and the barrier wall assembly along the plane.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
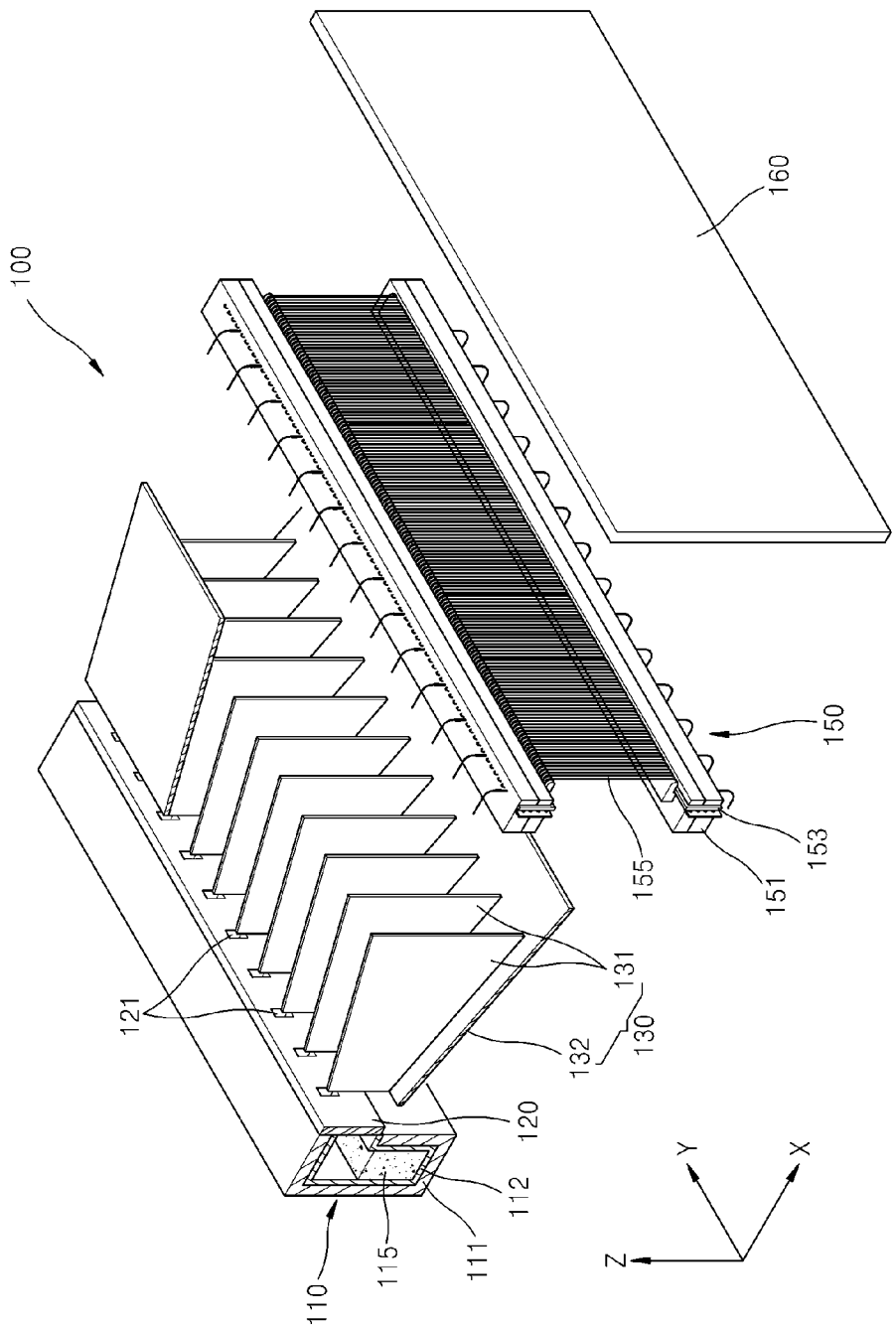
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
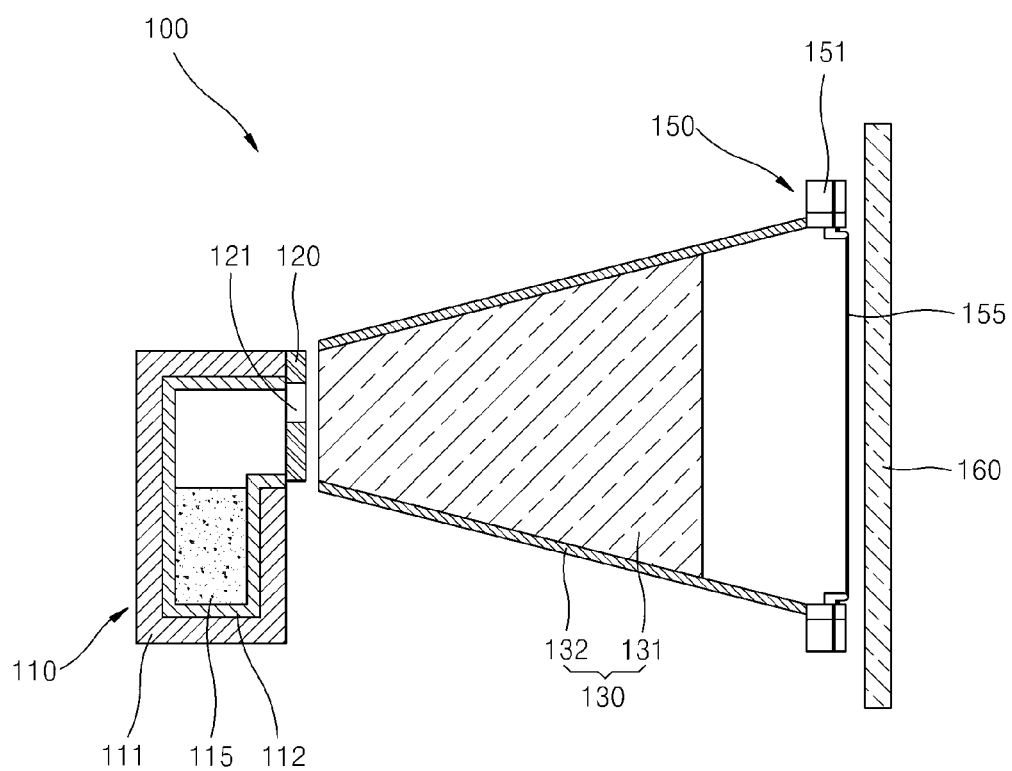
FIG. 2 is a schematic side view of the thin film deposition apparatus of FIG. 1, according to an embodiment of the present embodiment.
Figure 3:
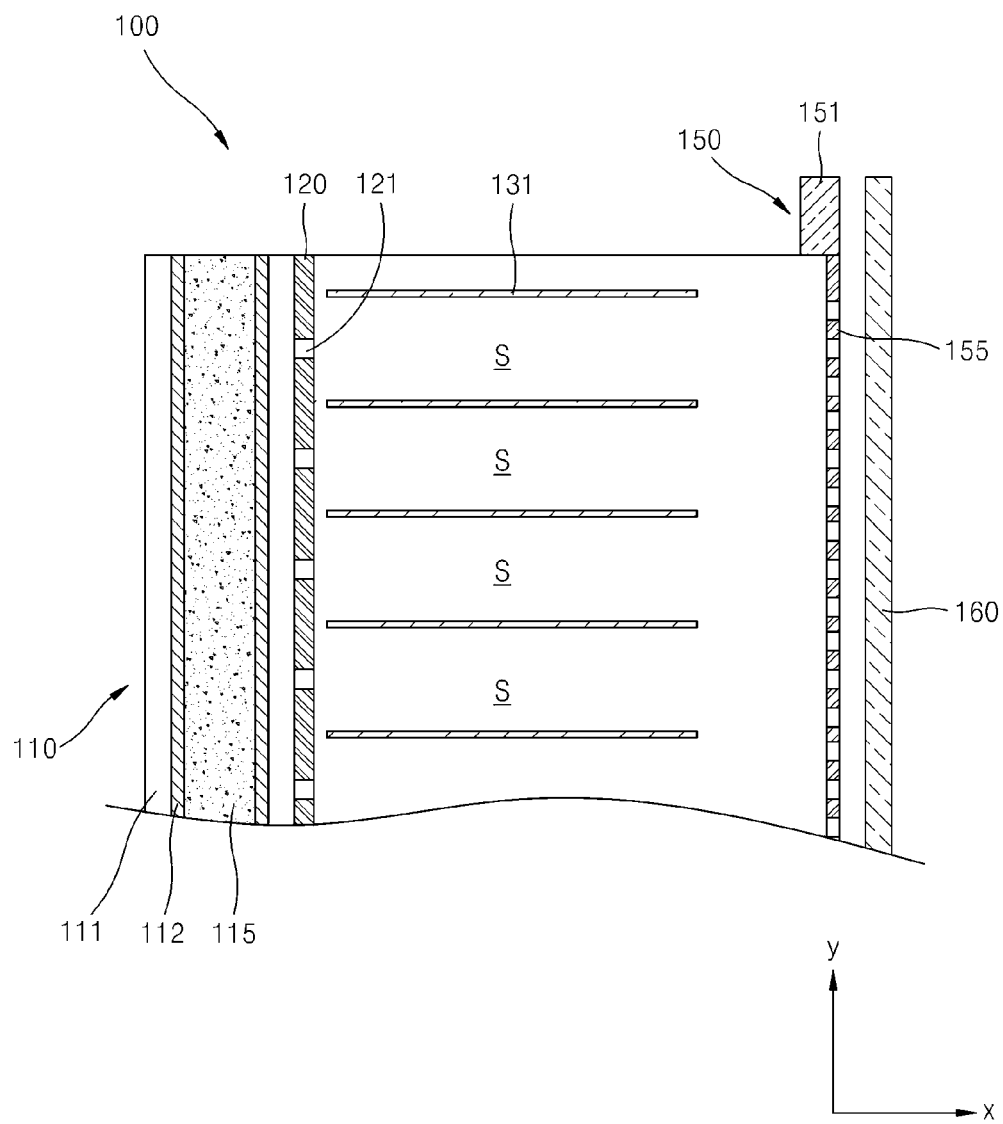
FIG. 3 is a schematic plan view of the thin film deposition apparatus of FIG. 1, according to an embodiment of the present embodiment.

FIG. 1 is a schematic perspective view of a thin film deposition apparatus 100 according to an embodiment of the present invention. FIG. 2 is a schematic side view of the thin film deposition apparatus 100. FIG. 3 is a schematic plan view of the thin film deposition apparatus 100. Referring to FIGS. 1, 2 and 3, the thin film deposition apparatus 100 includes a deposition source 110, a first nozzle 120, a barrier wall assembly 130, and a second nozzle assembly 150. A substrate 160 upon which a deposition material 115 is deposited is also shown.

Although a chamber is not illustrated in FIGS. 1, 2 and 3 for convenience of explanation, all the components of the thin film deposition apparatus 100 and the substrate 160 may be disposed within a chamber that is maintained at an appropriate degree of vacuum. The chamber is maintained at an appropriate vacuum so as to allow the deposition material 115 to move straight.

In particular, the chamber should be maintained in a high-vacuum state as in a deposition method using a fine metal mask (FMM) so as to deposit the deposition material 115 on the substrate 160 via the first nozzle 120 and the second nozzle assembly 150. In addition, the temperatures of the barrier wall assembly 130 and the second nozzle assembly 150 have to be sufficiently lower than the temperature of the deposition source 110. In this regard, the temperatures of the barrier wall assembly 130 and the second nozzle assembly 150 may be about 100° C. or less. This is because the deposition material 115 that has collided against the barrier wall assembly 130 may not be vaporized again when the temperature of the barrier wall assembly 130 is sufficiently low. In addition, the thermal expansion of the second nozzle assembly 150 may be minimized when the temperature of the second nozzle assembly 150 is sufficiently low.

The barrier wall assembly 130 faces the deposition source 110 which is at a high temperature. The temperature of a portion of the first barrier wall assembly 130 close to the deposition source 110 rises by a maximum of about 167° C., and thus a partial-cooling apparatus may be further included if needed. To this end, the barrier wall assembly 130 may include a cooling member. However, it is understood that other maximum temperatures can be implemented in other aspects of the invention.

The substrate 160, on which the deposition material 115 is to be deposited, is disposed in the chamber. The substrate 160 may be a substrate for flat panel displays. A large substrate, such as a mother glass, for manufacturing a plurality of flat panel displays, may be used as the substrate 160. However, the invention is not limited thereto.

The deposition source 110 contains and heats the deposition material 115. The deposition source 110 is disposed on a side of the chamber opposite to a side on which the substrate 160 is disposed. As the deposition material 115 contained in the deposition source 110 is vaporized, the deposition material 115 is deposited on the substrate 160. Specifically, the deposition source 110 includes a crucible 111 that is filled with the deposition material 115, and a heater 112 that heats the crucible 111 to vaporize the deposition material 115, which is contained in the crucible 111. The vaporized deposition material 115 moves towards a side of the crucible 111, and in particular, towards the first nozzle 120.

The first nozzle 120 is disposed at a side of the deposition source 110, and in particular, at the side of the deposition source 110 facing the substrate 160 so as to be between the substrate 160 and the side of the deposition source 110. The first nozzle 120 includes a plurality of first slits 121 that may be arranged at equal intervals in a Y-axis direction. The deposition material 115 that is vaporized in the deposition source 110, passes through the first nozzle 120 towards the substrate 160.

The barrier wall assembly 130 is disposed at a side of the first nozzle 120 so as to be between the first nozzle 120 and a second nozzle 150. The barrier wall assembly 130 includes a plurality of barrier walls 131, and a barrier wall frame 132 that covers sides of the barrier walls 131. The barrier walls 131 are arranged parallel to each other at equal intervals in Y-axis direction. In addition, each of the barrier walls 131 is arranged parallel to an XZ plane in FIG. 1 (i.e., perpendicular to the Y-axis direction). The plurality of barrier walls 131 arranged as described above partition the space between the first nozzle 120 and the second nozzle assembly 150, which will be described later. In the thin film deposition assembly 100 according to the current embodiment of the present invention, the deposition space is divided by the barrier walls 131 into sub-deposition spaces S that respectively correspond to the first slits 121 through which the deposition material 115 is discharged. However, the relative spacing and orientation is not limited to the shown configuration in all aspects of the invention.

The barrier walls 131 may be respectively disposed between adjacent first slits 121 as shown. Specifically, each of the first slits 121 is disposed between two adjacent barrier walls 131. The first slits 121 may be respectively located at the midpoint between two adjacent barrier walls 131. Since the barrier walls 131 partition the space between the first nozzle 120 and the second nozzle assembly 150, the deposition material 115 discharged through each of the first slits 121 is not mixed with the deposition material 115 discharged through the other first slits 121, and passes through second slits 150 so as to be deposited on the substrate 160. Thus, the barrier walls 131 guide the deposition material 115 after being discharged through the first slits 121 to not flow in the Y-axis direction.

Referring back to FIG. 1, as described above, the first barrier wall frame 132 surrounds sides of the first barrier walls 131. The barrier wall frame 132 covers upper and lower sides of the barrier walls 131, supports the barrier walls 131, and guides the deposition material 115, which is discharged through the first slits 121, not to flow in a Z-axis direction.

While not required in all aspects, the barrier wall assembly 130 may be constructed to be detachable from the thin film deposition apparatus 100. A conventional FMM deposition method has a low deposition efficiency. The deposition efficiency refers to the ratio of a deposition material deposited on a substrate to the deposition material vaporized from a deposition source. The conventional FMM deposition method has a deposition efficiency of about 32%. Furthermore, in the conventional FMM deposition method, about 68% of organic deposition material, which has not been deposited on the substrate, remains adhered to a deposition apparatus, and thus it is not straightforward to reuse the deposition material.

So as to overcome these and other problems, the thin film deposition apparatus 100 according to the current embodiment of the present invention encloses the deposition space using the barrier wall assembly 130. In this way, the deposition material 115 that remains undeposited is mostly deposited within the barrier wall assembly 130. Thus, when a large amount of the deposition material 115 lies in the barrier wall assembly 130 after a long deposition process, the barrier wall assembly 130 may be detached from the thin film deposition apparatus 100 and then placed in a separate deposition material recycling apparatus to recover the deposition material 115. Due to the structure of the thin film deposition apparatus 100 according to the present embodiment, a reuse rate of the deposition material 115 is increased, the deposition efficiency is improved, and the manufacturing costs are reduced.

The second nozzle assembly 150 is disposed between the deposition source 110 and the substrate 160 and includes a plurality of strings 155. The deposition material 115 that is vaporized in the deposition source 110, passes through the first nozzle 120 and the second nozzle assembly 150 towards the substrate 160. The construction of the second nozzle assembly 150 will be described in detail later with reference to FIG. 5.

In the shown thin film deposition assembly 100, the total number of strings 155 is greater than the number of first slits 121. In addition, in each of the sub-deposition spaces S, the total number of strings 155 is greater than the number of first slits 121.

While not limited thereto, at least one first slit 121 is disposed between each two adjacent barrier walls 131. Meanwhile, a plurality of the strings 155 is disposed between each two adjacent barrier walls 131. The space between the first nozzle 120 and the second nozzle assembly 150 is partitioned by adjacent barrier walls 131 into sub-deposition spaces S that correspond to the first slits 121, respectively. Thus, the deposition material 115 discharged from each of the first slits 121 passes through the plurality of strings 155 disposed in the sub-deposition space S corresponding to the first slit 121, and is then deposited on the substrate 160.

In particular, in the conventional FMM deposition method, the size of an FMM has to be equal to the size of a substrate. Thus, the size of the FMM has to be increased as the substrate becomes larger. However, it is neither straightforward to manufacture a large FMM nor to extend an FMM to be accurately aligned with a pattern. However, in the thin film deposition apparatus 100 according to the current embodiment of the present invention, a thin film is deposited while the thin film deposition apparatus 100 is moved in the Z-axis direction within the chamber (not shown). In other words, in the thin film deposition apparatus 100 according to the current embodiment of the present invention, deposition is continuously performed while either the thin film deposition apparatus 100 or the substrate 160 is moved relative to each other in the Z-axis direction. Thus, in the thin film deposition apparatus 100 according to the current embodiment of the present invention, the second nozzle assembly 150 may be significantly smaller than an FMM used in a conventional deposition method.

As such, in the thin film deposition apparatus 100 according to the current embodiment of the present invention, the length of the second nozzle assembly 150 in the Z-axis direction may be less than the length of the substrate 160 in the Z-axis direction. The width of the second nozzle assembly 150 in the Y-axis direction is equal to the width of the substrate 160 in the Y-axis direction. As described above, since the second nozzle assembly 150 may be formed to be significantly smaller than an FMM used in a conventional deposition method, it is easy to manufacture the second nozzle assembly 150 used in the present invention. That is, the second nozzle assembly 150 is easier to manufacture than an FMM used in a conventional deposition method. This is more advantageous for a relatively large display device.

While not required in all aspects, the barrier wall assembly 130 and the second nozzle assembly 150 are separated from each other by a predetermined distance. The barrier wall assembly 130 and the second nozzle assembly 150 are separated from each other for the following reasons.

The second nozzle assembly 150 needs to be aligned with the substrate 160 to be accurate in position and to have a constant interval therebetween, and thus require high-precision control. Thus, so as to make it easy to control such parts that require high-precision control, the second nozzle assembly 150 is separated from the deposition source 110, the first nozzle 120 and the barrier wall assembly 130, which are relatively heavy parts not requiring precise control. Also, the temperature of the barrier wall assembly 130 may increase to 100° C. or higher due to the deposition source 110 whose temperature is high. Thus, so as to prevent the heat of the barrier wall assembly 130 from being conducted to the second nozzle assembly 150, the barrier wall assembly 130 and the second nozzle assembly 150 are separated from each other. In the thin film deposition apparatus 100 according to the current embodiment of the present invention, the deposition material 115 adhered to the barrier wall assembly 130 is mostly reused, whereas the deposition material 115 adhered to the second nozzle assembly 150 may not be reused. Thus, when the barrier wall assembly 130 is separated from the second nozzle assembly 150, it may be straightforward to recover the deposition material 115 to be reused. Finally, a partition (not shown) may be further installed so as to prevent deposition of the deposition material 115 on the second nozzle assembly 150 after deposition onto the substrate 160 has been completed and before another target is subjected to deposition. This may extend a nozzle exchange cycle. It is straightforward to install the partition between the barrier walls 131 and the second nozzle assembly 150. In addition, a calibration plate (not shown) may be further installed so as to ensure uniformity of a thin film over the entire substrate 160. When the barrier walls 131 are separated from the second nozzle assembly 150, it is very straightforward to install the calibration plate.

Figure 4A:
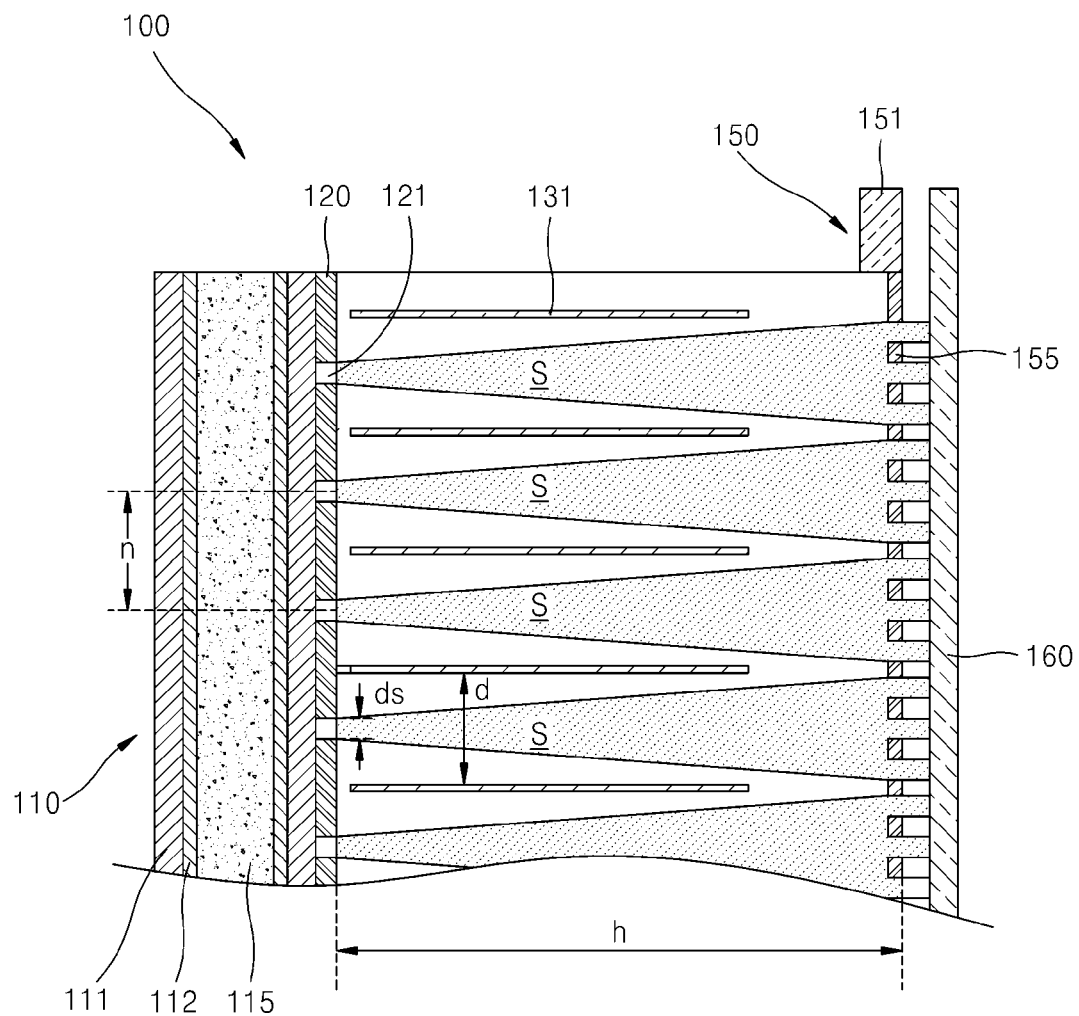
FIG. 4A is a schematic view illustrating deposition of a deposition material in the thin film deposition apparatus of FIG. 1, according to an embodiment of the present invention.
Figure 4B:
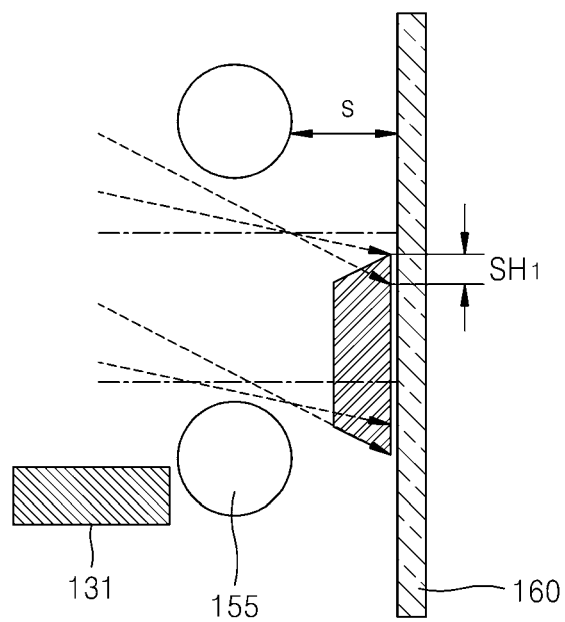
FIG. 4B illustrates a shadow zone formed on a substrate when a deposition space is partitioned by barrier walls, as illustrated in FIG. 4A.
Figure 4C:
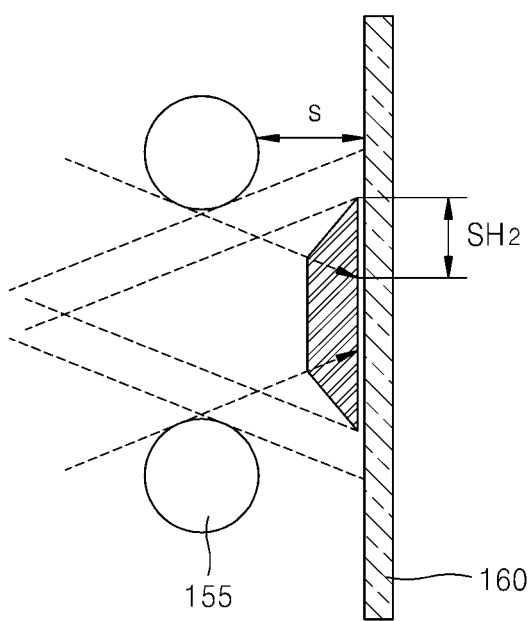
FIG. 4C illustrates a shadow zone formed on the substrate when the deposition space is not partitioned.

FIG. 4A is a schematic view illustrating deposition of the deposition material 115 in the thin film deposition apparatus 100, according to an embodiment of the present invention. FIG. 4B illustrates a shadow zone formed on the substrate 160 when the deposition space is not partitioned by the barrier walls 131, as illustrated in FIG. 4A. FIG. 4C illustrates a shadow zone formed on the substrate 160 when the deposition space is not partitioned.

Referring to FIG. 4A, the deposition material 115 that is vaporized in the deposition source 110 is deposited on the substrate 160 by being discharged through the first nozzle 120 and the second nozzle assembly 150. Since the space between the deposition source nozzle unit 120 and the patterning slit sheet 150 is partitioned into a plurality of sub-deposition spaces S by the barrier walls 131, the deposition material 115 discharged through each of the first slits 121 is not mixed with the deposition material 115 discharged through the other adjacent first slits 121 due to the barrier walls 131.

When the space between the first nozzle 120 and the second nozzle assembly 150 is partitioned by the barrier wall assembly 130, as illustrated in FIGS. 4A and 4B, a width $SH_1$ of a shadow zone formed on the substrate 160 may be determined according to Equation 1 below.

$$SH_1 = s \ast d_s/h, \qquad \text{Equation 1}$$

where s denotes a distance between the second nozzle assembly 150 and the substrate 160, $d_s$ denotes a width of the first slits 121 close to the deposition source 110, and h denotes a distance between the deposition source 110 and the second nozzle assembly 150.

However, when the space between the first nozzle 120 and the second nozzle assembly 150 is not partitioned by the barrier walls 131, as illustrated in FIG. 4C, the deposition material 115 is discharged through the second nozzle assembly 150 at a wider range of angles than in the case of FIG. 4B. This is because the deposition material 115 discharged is not just through a first slit 121 directly facing a corresponding string 155 but also through first slits 121 other than the first slit 121 above, passes between a plurality of strings 155 and is then deposited on the substrate 160. Thus, a width $SH_2$ of a shadow zone formed on the substrate 160 is much greater than when the deposition space is partitioned by the barrier walls 131. The width $SH_2$ of the shadow zone formed on the substrate 160 is determined according to Equation 2.

$$SH_2=s*2n/h,$$ Equation 2 where s denotes a distance between the second nozzle assembly 150 and the substrate 160, n denotes an interval between adjacent first slits 121, and h denotes a distance between the deposition source 110 and the second nozzle assembly 150.

Referring to Equations 1 and 2, $d_s$, which is the width of the first slits 121, is several or several tens times less than n, which is the interval between the adjacent first slits 121. Thus, the shadow zone may have a smaller width when the space between the first nozzle 120 and the second nozzle assembly 150 is partitioned by the barrier walls 131. The width $SH_1$ of the shadow zone formed on the substrate 160 may be reduced by adjusting one or more of the following factors: by reducing the interval d between the adjacent barrier walls 131; by reducing the distance s between the second nozzle assembly 150 and the substrate 160; or by increasing the distance h between the deposition source 11 and the second nozzle assembly 150.

As described above, the shadow zone formed on the substrate 160 may be reduced by installing the barrier walls 131. Thus, the second nozzle assembly 150 can be separated from the substrate 160. Specifically, in the thin film deposition apparatus 100 according to the current embodiment of the present invention, the second nozzle assembly 150 is disposed apart from the substrate 160 by a predetermined distance. In contrast, in a conventional deposition method using a FMM, deposition is performed with the FMM in close contact with a substrate so as to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

So as to overcome this problem, in the thin film deposition apparatus 100 according to the current embodiment of the present invention, the second nozzle assembly 150 is separated from the substrate 160 by a predetermined distance. This may be implemented by installing the barrier walls 131 to reduce the width of the shadow zone formed on the substrate 160, although aspects can be implemented without the barrier walls 131.

As described above, according to an embodiment of the present invention, a mask is formed to be smaller than the substrate 160, and deposition is performed while the mask is moved relative to the substrate 160. Thus, the mask can be easily manufactured. In addition, a defect caused due to the contact between a substrate and an FMM, which occurs in the conventional deposition method, may be prevented. In addition, since it is unnecessary to use the FMM in close contact with the substrate during a deposition process, the manufacturing speed may be improved.

Figure 5:
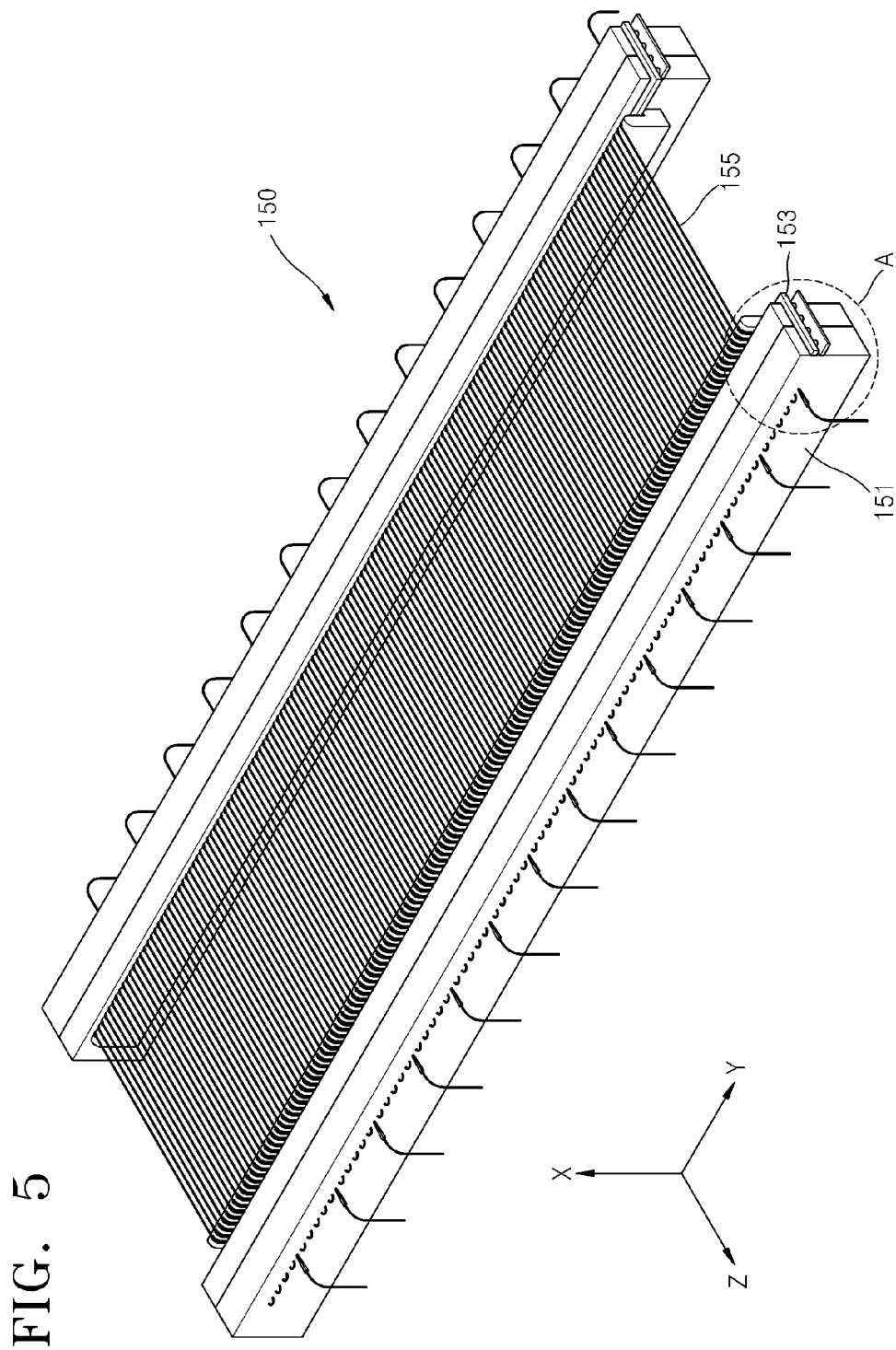
FIG. 5 is a schematic perspective view of a second nozzle assembly included in the thin film deposition apparatus of FIG. 1, according to an embodiment of the present invention.

A second nozzle assembly 150 included in the thin film deposition apparatus 100 according to an embodiment of the present invention will now be described in detail in relation to FIGS. 1 and 5. FIG. 5 is a schematic perspective view of the second nozzle assembly 150 included in the thin film deposition apparatus 100 of FIG. 1, according to an embodiment of the present invention. Referring to FIG. 5, the second nozzle assembly 150 includes a plurality of second nozzle frames 151, a plurality of elastic units 153, and the plurality of strings 155.

Specifically, in the current embodiment, two nozzle frames 151 are disposed to face each other while being separated from each other by a predetermined distance. The distance between the two nozzle frames 151 corresponds to a width of a thin film to be formed on the substrate 160. The second nozzle frames 151 may be formed of a material having good strength, such as metal, and particularly, iron.

The elastic units 153 are disposed on the second nozzle frames 151, respectively. The elastic units 153 apply a predetermined elastic force to the plurality of strings 155 so that the strings 155 are maintained in tension. Both ends of the plurality of strings 155 are fixed by the two second nozzle frames 151 that face each other. The deposition material 115 is deposited on the substrate 160 via the spaces between the plurality of strings 155, thereby forming a pattern corresponding to the spaces on the substrate 160.

In the thin film deposition apparatus 100 according to the current embodiment of the present invention, the second nozzle assembly 150 acts as a conventional mask and is formed using the plurality of strings 155 without an FMM. While not required in all aspects, materials that may be used to form the plurality of strings 155 should generally satisfy the following conditions. First, materials for the plurality of strings 155 may be used in a vacuum state, since a deposition process using the thin film deposition apparatus 100 is generally performed in a chamber under high vacuum conditions. Second, materials for the plurality of strings 155 need to have highly precisely cut ends and regular thickness. If the thickness of the materials is not regular, a uniform pattern cannot be obtained. Third, materials for the plurality of strings 155 need to have high mechanical strength. For example, materials that have high ultimate strength and that can be extended within a range of several % may be used to form the plurality of strings 155. Fourth, materials for the plurality of strings 155 need to be easily processed and to have a variety of sizes. That is, the materials need to be chosen such that the plurality of strings 155 are formed to have a desired diameter and to be easily cut. Furthermore, materials for the plurality of strings 155 are preferably inexpensive.

For example and without limitation thereto, the materials for the plurality of strings 155 that satisfy the above conditions may be selected from the group consisting of glass fiber, boron fiber, an aramid or para-aramid fiber such as a KEVLAR fiber, and carbon fiber. From among the group, boron fiber, an aramid or para-aramid fiber such as a KEVLAR fiber, or carbon fiber may be used in consideration of good mechanical strength, and glass fiber may be used in consideration of cost.

Figure 6:
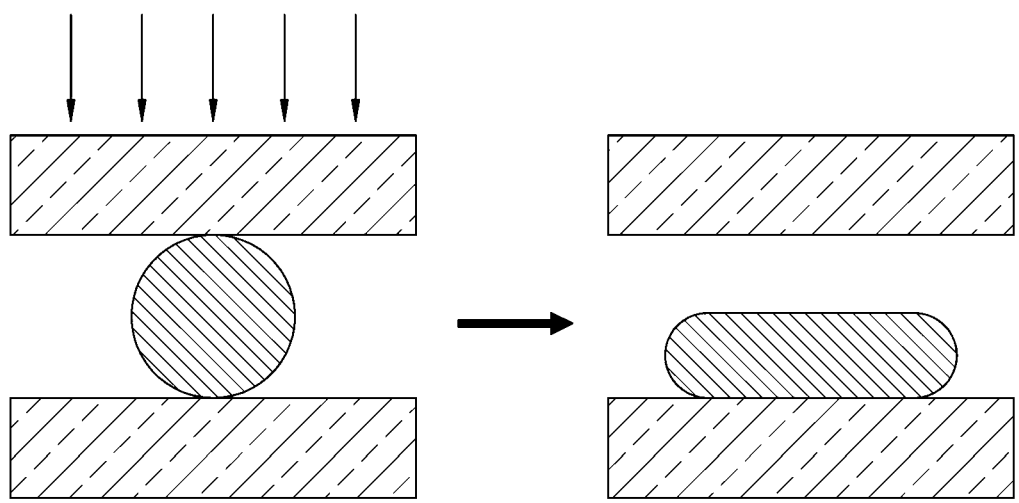
FIG. 6 is a diagram for describing a method of molding a glass fiber so as to form the second nozzle assembly of FIG. 5, according to an embodiment of the present invention.

In particular, the glass fiber is advantageous in that it can be formed in various shapes. FIG. 6 is a diagram for describing a method of forming glass fiber so as to form the second nozzle assembly 150 of FIG. 5, according to an embodiment of the present invention. Referring to FIG. 6, the glass fiber may be formed in a desired shape by heating the glass fiber to a softening point and applying pressure thereto. In this case, the glass fiber may be formed to have a stepped shape similar to that of an FMM in a conventional deposition method. For example, so as to manufacture a 40-inch full high-density (HD) display, a width of an area of the substrate 160, on which a thin film is not formed, is about 320 µm. Thus, each of the plurality of stings 155 may have a width of 320 µm and a thickness of 100 µm or less.

However, boron fiber, KEVLAR fiber, and carbon fiber cannot be heated to be molded. Thus, if these materials are used to form the plurality of strings 155, each of the plurality of strings 155 may have a round cut end (i.e., cross section). In this case, the diameter of each of the plurality of strings 155 may be equal to the width of the area of the substrate 160, on which a thin film is not formed. For example, in the case of a 40-inch full HD display, the width of the area of the substrate 160, on which a thin film is not formed, is about 320 µm, and thus, the diameter of each of the plurality of strings 155 is also 320 µm, thereby increasing the thickness of the second nozzle assembly 150. If the thickness of the second nozzle assembly 150 is increased as described above, a shadow zone formed on the substrate 160 decreases but the deposition material 115 that does not pass through the second nozzle assembly 150 is accumulated on the plurality of strings 155. Thus, the diameter of the plurality of strings 155 continuously increases over time, thereby reducing the width of a film deposited on the substrate 160. A method of solving this problem will be described later in detail with reference to FIG. 12.

As described above, in the current embodiment of the present invention, since the plurality of strings 155 are used as a shield for the deposition material 115, it is very easy to form a high pitch pattern by adjusting the thickness of the plurality of strings 155 and the distances between every two adjacent strings 155. In addition, the plurality of strings 155 are far lighter in weight than an FMM used in a conventional deposition method and thus facilitate a deposition process for fabricating on a large-sized display.

Figure 7A:
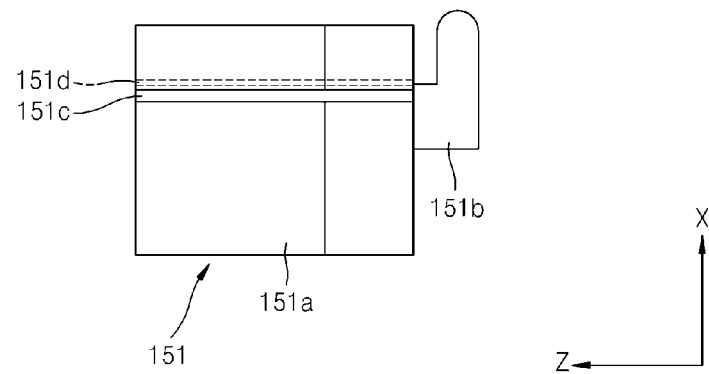
FIG. 7A is a front view of a second nozzle frame included in the thin film deposition apparatus of FIG. 1, according to an embodiment of the present invention.
Figure 7B:
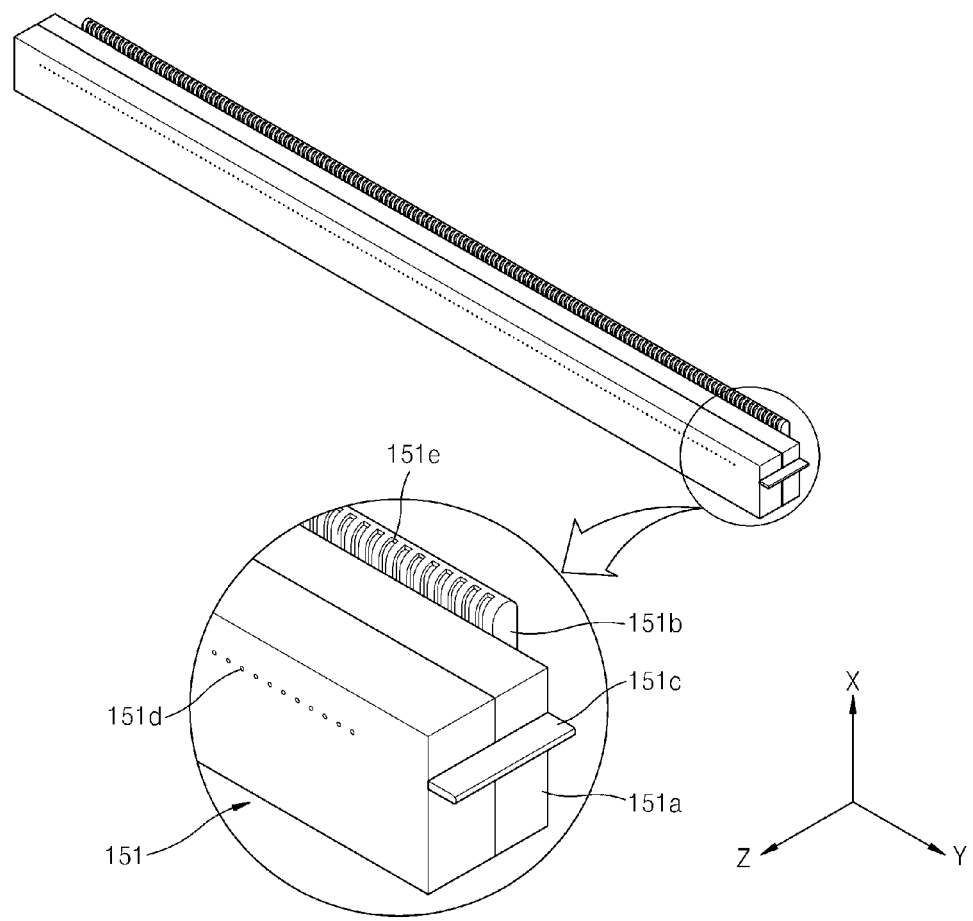
FIG. 7B is a perspective view of the second nozzle frame of FIG. 7A.

The elements of a second nozzle assembly 150 included in a thin film deposition apparatus and the relations between the elements according to an embodiment of the present invention will now be described in detail in relation to FIGS. 1, 7A and 7B. FIG. 7A is a front view of one of the second nozzle frames 151 included in the thin film deposition apparatus 100 of FIG. 1, according to an embodiment of the present invention. FIG. 7B is a perspective view of the second nozzle frame 151 of FIG. 7A. Referring to FIGS. 7A and 7B, the second nozzle frame 151 includes a body unit 151a, a string supporting unit 151b, and a plurality of elastic unit supporting units 151c.

The body unit 151a has an approximately long rectangular pole shape. The string through-holes 151d are formed in the body unit 151a and are separated in the Y-axis direction. The plurality of strings 155 of FIG. 5 are inserted into the string through-holes 151d to pass through the body unit 151a.

The string unit supporting unit 151b protrudes from a side of the body unit 151a, and particularly, the side of the body unit 151a facing the other second nozzle frame 151. An upper part of the string unit supporting unit 151b is higher by a predetermined distance than an upper part of the body unit 151a, but the invention is not limited thereto. A plurality of string accommodating grooves 151e are formed in an upper part of the string supporting unit 151b, in which the plurality of strings 151 are disposed. The plurality of string accommodating grooves 151e have a cut end similar to that of the plurality of strings 155 so as to fix the plurality of strings 155 not to swing from side to side while supporting the plurality of strings 155.

As shown, the elastic unit supporting units 151c are formed at both ends of the body unit 151a, respectively. The elastic unit supporting units 151c protrude from both the ends of the body unit 151a, respectively, and the elastic unit 153, which will be described in detail later, is disposed on the elastic unit supporting units 151c.

Figure 8A:
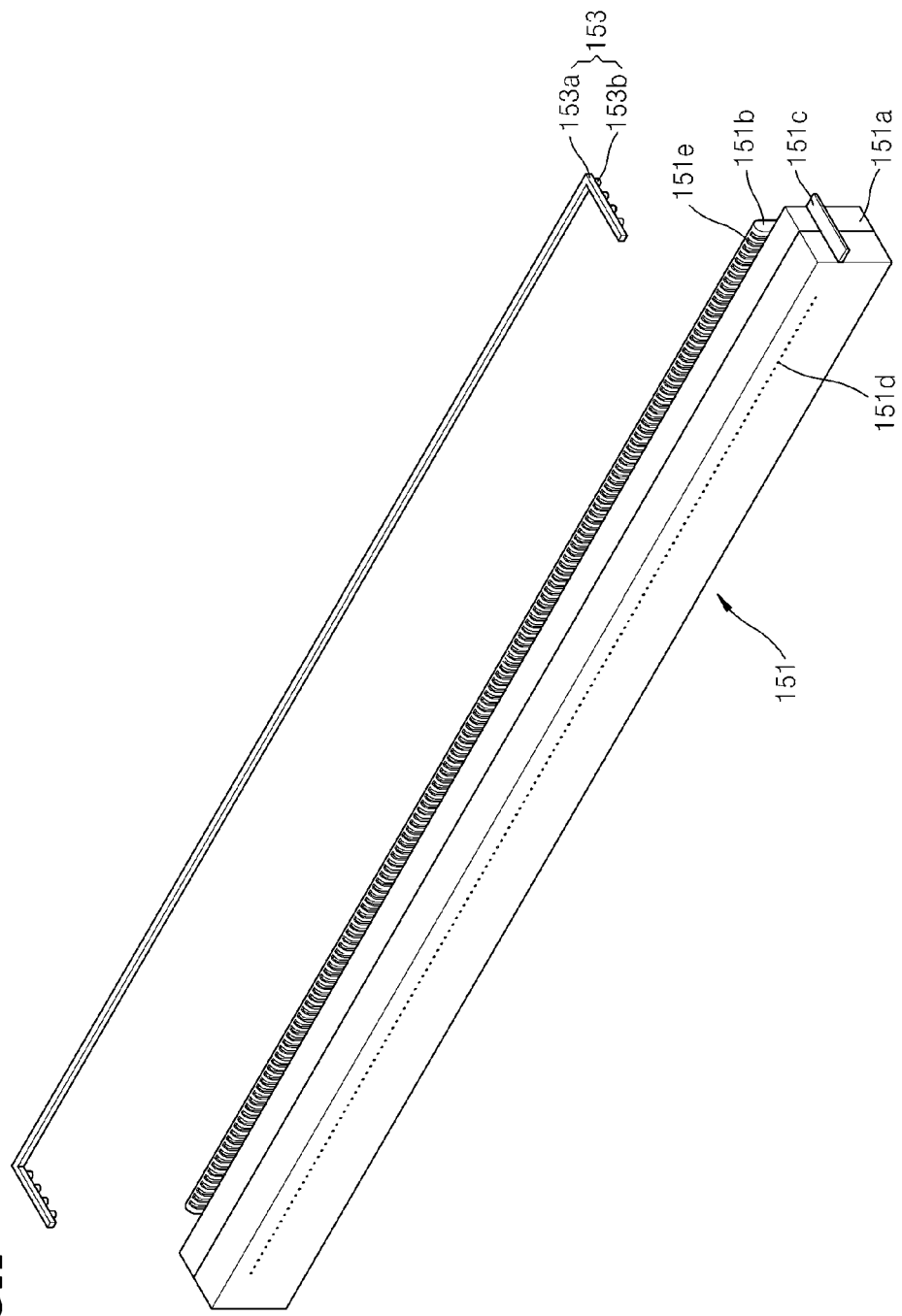
FIG. 8A is an exploded perspective view of the second nozzle frame and an elastic unit included in the thin film deposition apparatus of FIG. 1, according to an embodiment of the present invention.
Figure 8B:
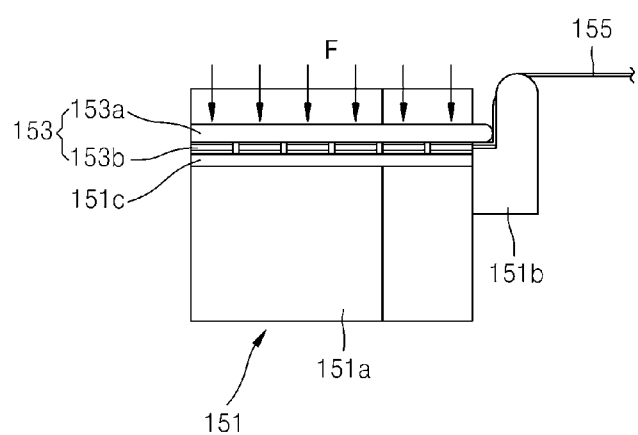
FIG. 8B is a front view illustrating a state in which the second nozzle frame and the elastic unit of FIG. 8A are combined with each other, according to an embodiment of the present invention.

FIG. 8A is an exploded perspective view of one of the second nozzle frames 151 and the elastic unit 153 included in the thin film deposition apparatus of FIG. 1, according to an embodiment of the present invention. FIG. 8B is a front view illustrating a state in which the second nozzle frame 151 and the elastic unit 153 of FIG. 8A are combined with each other, according to an embodiment of the present invention. Referring to FIGS. 8A and 8B, the elastic unit 153 includes a frame 153a and a plurality of elastic bodies 153b combined with the frame 153a. The frame 153a is a bar type frame that is bent twice and has a "⊃" shape approximately. Both ends of the bent frame 153a are disposed on the elastic unit supporting units 151c of the second nozzle frame 151, respectively. A center part of the bent frame 153a is disposed between the body unit 151a and the string supporting unit 151b of the second nozzle frame 151.

The elastic bodies 153b may be embodied as a tension spring. Here, the tension spring is completely pressed in an initial state and generates a restoration force to return to the original position when it is extended. One end of the plurality of elastic bodies 153b may be combined with the frame 153a and the other end thereof may be combined with the elastic unit supporting unit 151c of the second nozzle frame 151. Thus, in the initial stage, the second nozzle frame 151 and the elastic unit 153 may be combined to firmly contact each other due to the elastic force applied by the plurality of elastic bodies 153b.

Also, as illustrated in FIG. 8B, if the elastic unit 153 passes between the plurality of strings 155 of FIG. 5 while being slightly extended upward, then the elastic unit 153 presses the plurality of strings 155 in a direction marked by arrows in FIG. 8B due to the restoration force applied by the plurality of elastic bodies 153b. Thus, the plurality of strings 155 are fixed at a constant location while being in tension.

Figure 9:
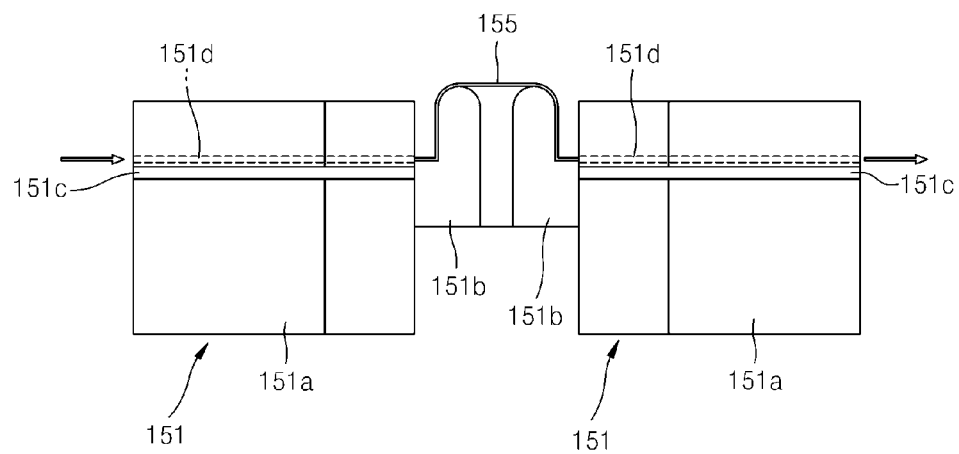
FIG. 9 is a front view illustrating a state in which a plurality of strings are inserted through the second nozzle frame in the thin film deposition apparatus of FIG. 1, according to an embodiment of the present invention.

FIG. 9 is a front view illustrating a state in which the plurality of strings 155 are inserted to pass through one of the second nozzle frames 151 in the thin film deposition apparatus 100 of FIG. 1, according to an embodiment of the present invention. Referring to FIG. 9, a process of installing the plurality of strings 155 into the second nozzle frame 151 will now be described. As described above, the string through-holes 151d have a shape that is the same as the cut end (i.e., cross section) of the plurality of strings 155 and are formed in the body unit 151a of the second nozzle frame 151. The strings 155 are inserted into the through-holes 151d to pass through the plurality of string through-holes 151d toward the string supporting unit 151b, respectively. Then, the plurality of strings 155 pass through the string supporting unit 151b and protrude toward the other second nozzle frame 151 facing the plurality of strings 155 via the plurality of string accommodating grooves 151e. Once the plurality of strings 155 reach the other second nozzle frame 151, the plurality of strings 155 are inserted into the plurality of string through-holes 151d to pass through the plurality of string through-holes 151d via the string accommodating grooves 151e, thereby passing through the other second nozzle frame 151. Thus, the strings 155 pass through the other second nozzle frame 151 in a reverse manner than that of the first second nozzle frame 151. That is, the strings 155 pass through the plurality of string through-holes 151d via the string supporting unit 151b.

While not required, several thousands of strings 155 may be disposed between the two second nozzle frames 151 facing each other. In this case, each of the several thousands of strings 155 may be individually inserted into the second nozzle frames 151 as described above. Alternatively, long pieces of a string 155 may be inserted sequentially into the plurality of string through-holes 151d to pass through them and both ends of the pieces of strings 155 may be fixed in the same manner that a person's shoestrings are tied and pass through eyelets in a shoe.

Figure 10:
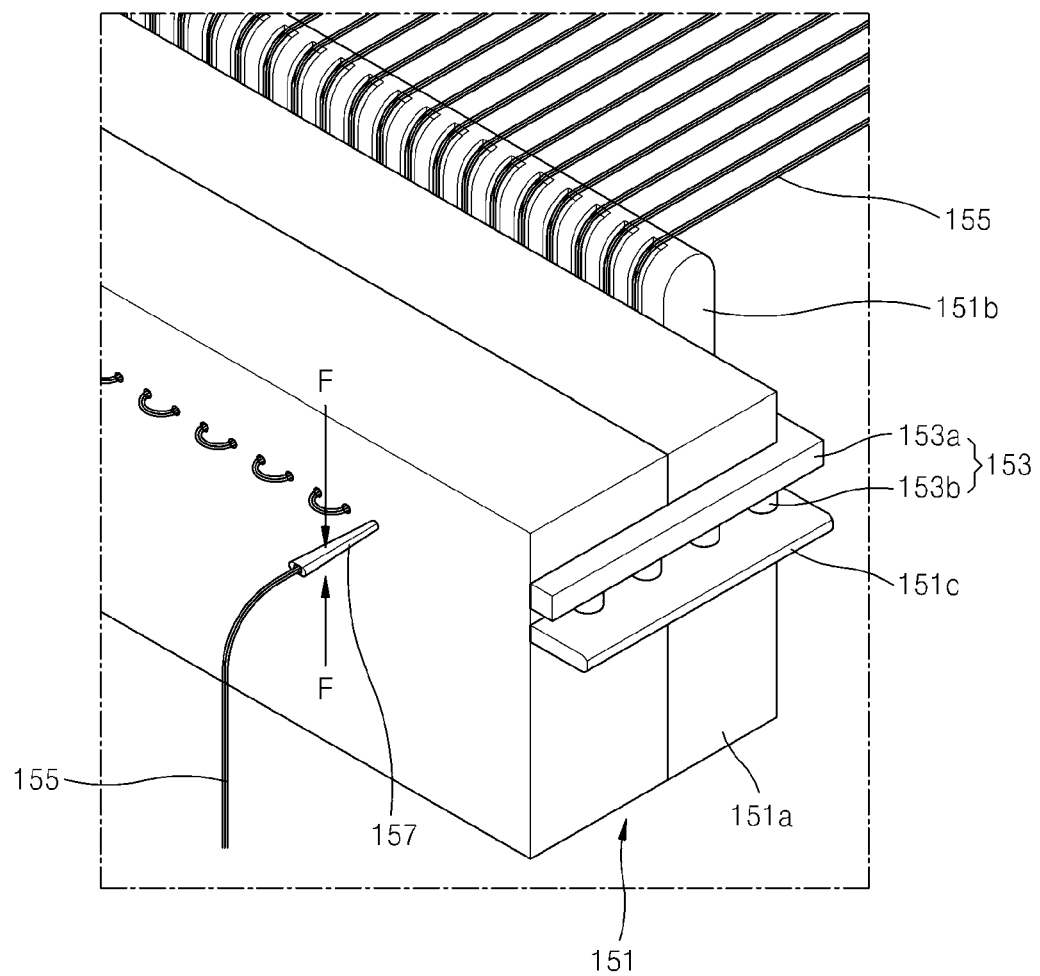
FIG. 10 is an enlarged view of a part A of the second nozzle assembly of FIG. 5, according to an embodiment of the present invention.

A method of inserting long pieces of strings sequentially into a plurality of string through-holes 151d to pass through them and fixing both ends of the pieces of strings 155 will now be described in relation to FIG. 10. FIG. 10 is an enlarged view of a part A of the second nozzle assembly 150 of FIG. 5, according to an embodiment of the present invention. Referring to FIG. 10, a method of inserting the plurality of strings 155 into the two second nozzle frames 151 facing each other is basically similar to a method of tying a person's shoestrings. First, as illustrated in to FIGS. 9 and 10, long pieces of strings 155 are inserted to pass through the string through-holes 151d of the two second nozzle frames 151 facing each other, are bent by 180 degrees, and are then inserted to pass through adjacent string through-holes 151d of the second nozzle frames 151. This process is repeatedly performed.

Next, both ends of the plurality of strings 155 are combined with a fixing unit 157 so that the plurality of strings 155 cannot be separated from the second nozzle frames 151. Alternatively, the second nozzle assembly 150 may have only one piece of string 155, and both ends of the piece of string 155 may be combined with the fixing unit 157. As illustrated in FIGS. 1, 5, and 10, the second nozzle assembly 150 has multiple strings 155, and the strings 155 may be inserted to pass through several tens to several hundreds of string through-holes 151d, respectively.

The reasons why the plurality of string through-holes 151d are divided into groups of a predetermined number of string through-holes 151d will now be described. First, fiber string has high strength and thus cannot be significantly extended. Thus, if several thousands of string through-holes 151d are connected using only one piece of string 155, one end of the piece of string 155 is fixed by the fixing unit 157, and the other end of the piece of string 155 is pulled, then it is difficult to apply a desired tension to all parts of the string 155, and the second nozzle frames 151 may be damaged. Second, when one piece of string 155 is cut from among the plurality of strings 155, the cut string 155 may be individually exchanged with another piece of string 155. Thus, the second nozzle assembly 150 can be conveniently managed and repaired.

When glass fiber is used to form the plurality of strings 155, the glass fiber may be united with the fixing unit 157 by applying heat and pressure thereto. That is, if an appropriate thermoplastic material is used to form the fixing unit 157 and the fixing unit 157 is united with the plurality of strings 155, then the fixing unit 157 fixes the plurality of strings 155 not to be separated from the second nozzle frames 151 when tension is applied to the plurality of strings 155. When the plurality of strings 155 are formed of boron fiber, KEVLAR fiber, or carbon fiber, the fixing unit 157 may be formed in a clip shape so as to fix the plurality of strings 155 not to be separated from the second nozzle frames 151.

As described above, according to an embodiment of the present invention, it is possible to easily fabricate the second nozzle assembly 150 at low cost by forming the second nozzle assembly 150 with a plurality of strings 155 that have high mechanical strength and that can be easily processed. Furthermore, it is very easy to fabricate a high-pitch pattern by adjusting the thickness of the plurality of strings 155 and the distance between each two adjacent strings 155. Also, it is possible to fabricate a large-sized display since the strings 155 are far lighter in weight than an FMM used in a conventional deposition method.

Figure 11A:
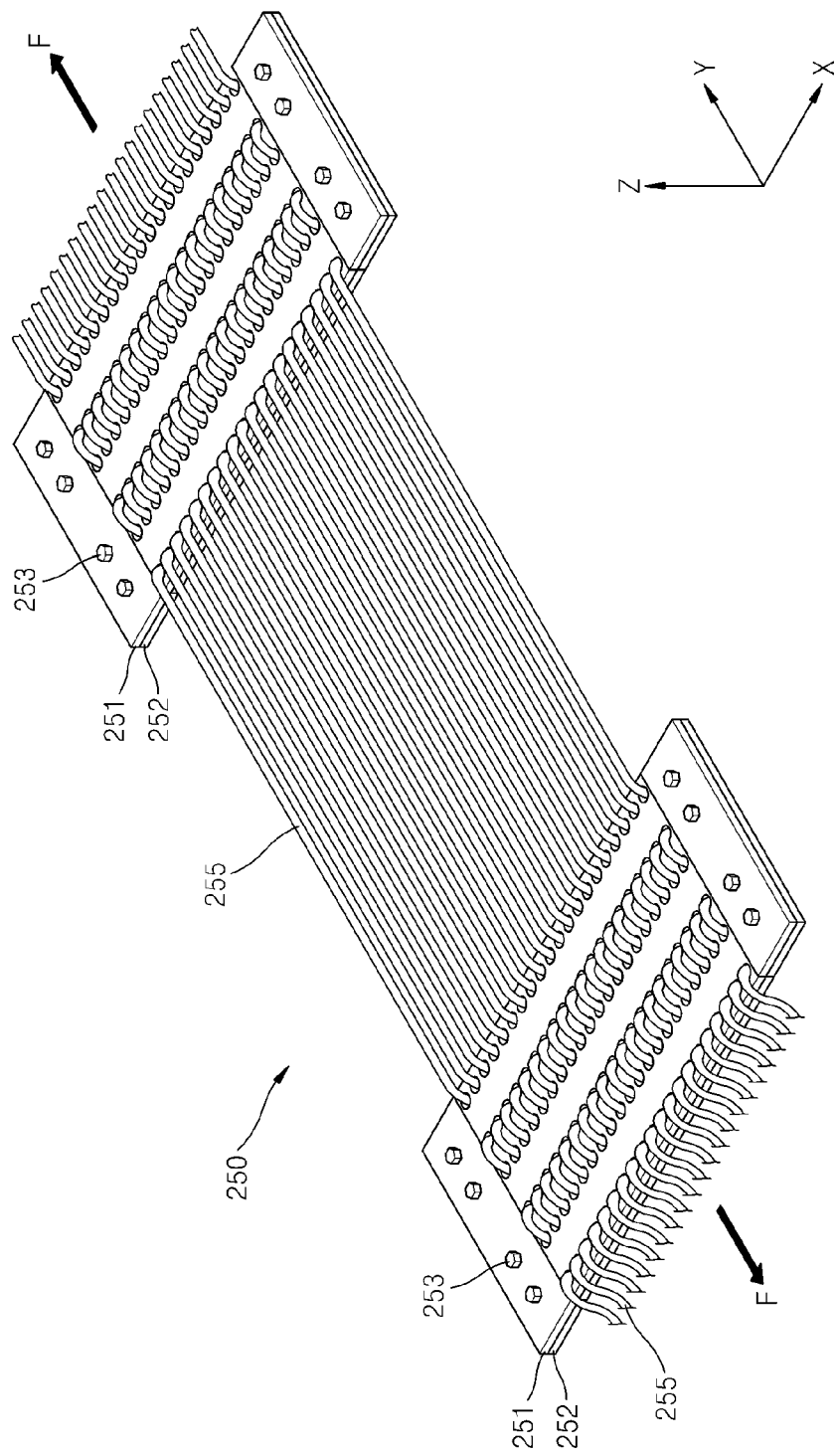
FIG. 11A is a schematic perspective view of a second nozzle assembly included in a thin film deposition apparatus according to another embodiment of the present invention.
Figure 11B:
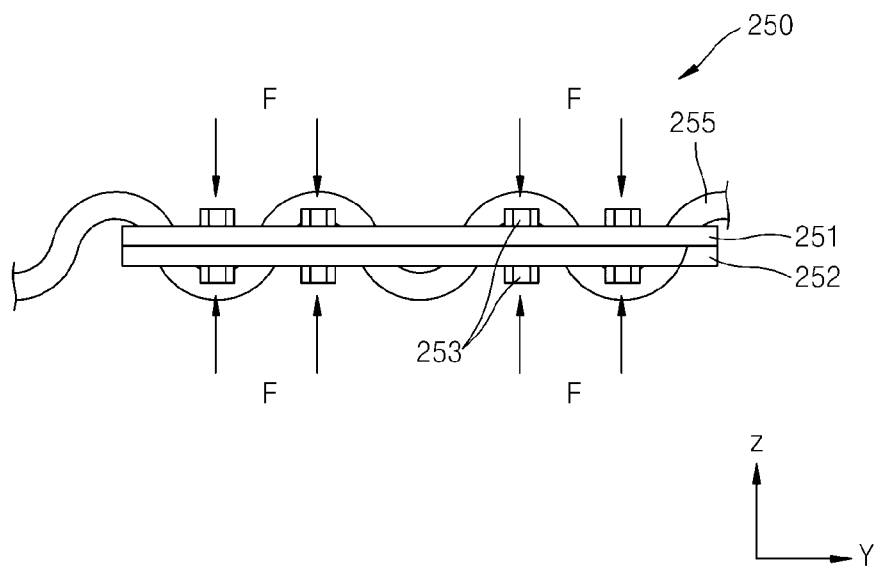
FIG. 11B is a side view of the second nozzle assembly of FIG. 11A.
Figure 11C:
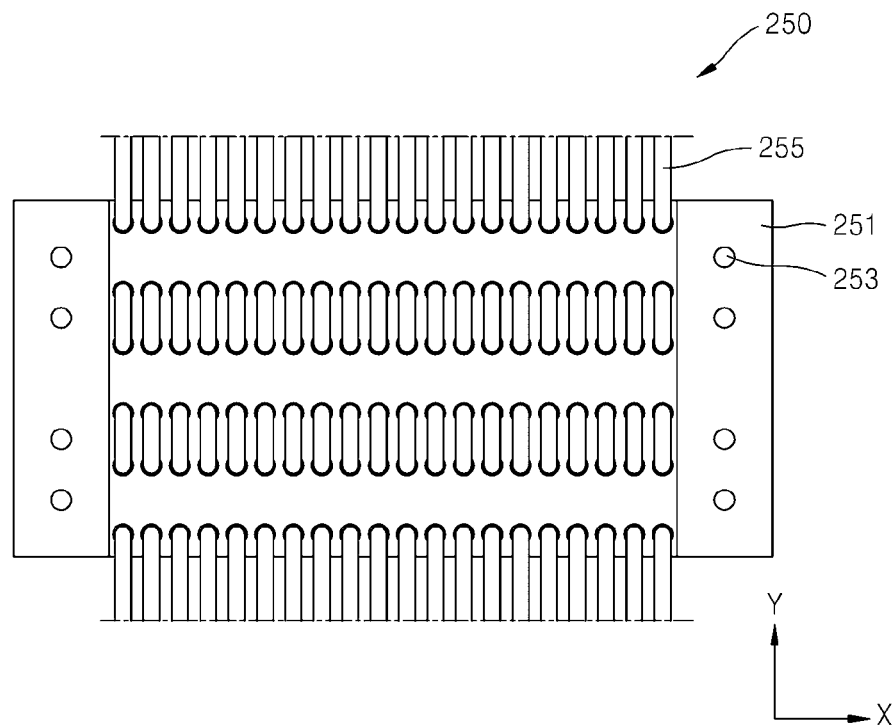
FIG. 11C is a plan view of the second nozzle assembly of FIG. 11A.
Figure 11D:
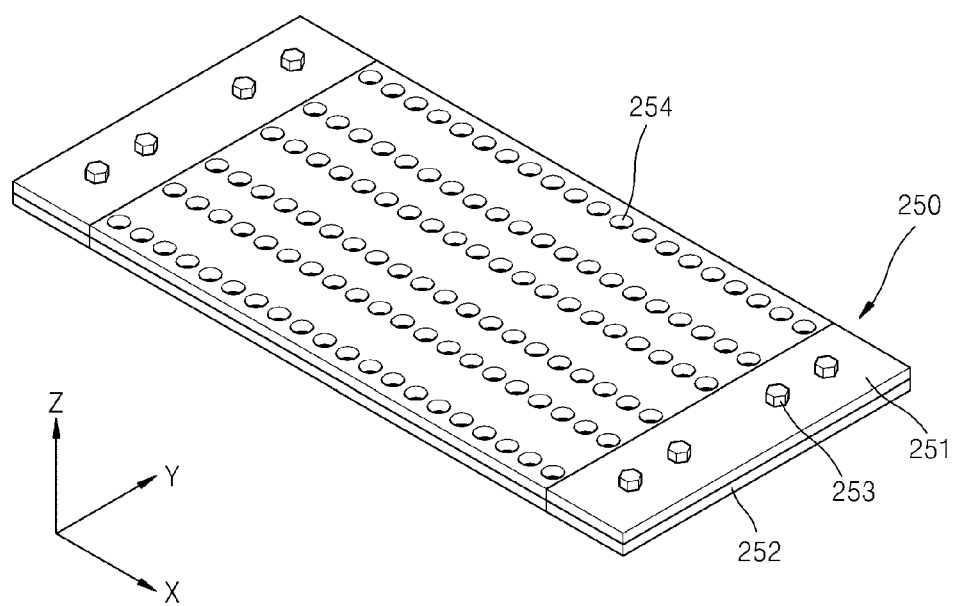
FIG. 11D is a perspective view illustrating only an upper second nozzle frame, a lower second nozzle frame, and a tightening unit included in the second nozzle assembly of FIG. 11A, according to an embodiment of the present invention.

FIG. 11A is a schematic perspective view of a second nozzle assembly 250 included in a thin film deposition apparatus according to another embodiment of the present invention. FIG. 11B is a side view of the second nozzle assembly 250 of FIG. 11A. FIG. 11C is a plan view of the second nozzle assembly 260 of FIG. 11A. FIG. 11D is a perspective view illustrating only an upper second nozzle frame 251, a lower second nozzle frame 252, and a plurality of tightening units 253 included in the second nozzle assembly 250 of FIG. 11A, according to an embodiment of the present invention. The second nozzle assembly 250 can be used in place of the second nozzle assembly 150 shown in the thin film deposition apparatus 100 of FIG. 1. Accordingly, the other elements of the thin film deposition apparatus 100 according to the current embodiment will not be described again here.

Referring to FIGS. 11A to 11D, the second nozzle assembly 250 includes a plurality of second nozzle frames 251, 252. The second nozzle assembly 250 may be used when the plurality of strings 255 are formed of a material, such as boron fiber, KEVLAR fiber, or carbon fiber, which cannot be molded using heat.

The upper second nozzle frames 251 and the lower second nozzle frames 252 are formed in a flat plate shape. A plurality of through-holes 254 are formed in the upper and lower nozzle frames 251, 252. The upper second nozzle frames 251 and the lower second nozzle frames 252 may be formed of metal, such as tool steel, which has high mechanical strength. However, the invention is not limited thereto.

The strings 255 are alternately inserted from bottom to top and from top to bottom through the through-holes 254 of the upper second nozzle frames 251 and the lower second nozzle frames 252, similar to needle work. Also, tightening units 253 are formed at both ends of the upper second nozzle frames 251 and the lower second nozzle frames 252. A predetermined pressure may be applied to the plurality of stings 255 by engaging, for example, the bolts with the nuts of the tightening units 253. Then, the predetermined pressure is applied to the plurality of strings 255 in a vertical direction (the Z-axis direction) and a strong frictional force is generated between the upper second nozzle frames 251, the lower second nozzle frames 252, and the plurality of strings 255 in a horizontal direction (the X-axis direction), thereby preventing the plurality of strings 255 from being separated from the upper second nozzle frames 251 and the lower second nozzle frames 252. In this case, the plurality of strings 255 may be combined with the upper second nozzle frames 251 and the lower second nozzle frames 252, respectively. Alternatively, a plurality of the upper second nozzle frames 251 and a plurality of the lower second nozzle frames 252 may be grouped to correspond to several tens of strings 255, such that only several tens of strings 255 are allocated to each of the upper second nozzle frames 251 and the lower second nozzle frames 252. While not required, examples of the tightening units 253 include pairs of bolts and nuts.

Figure 12:
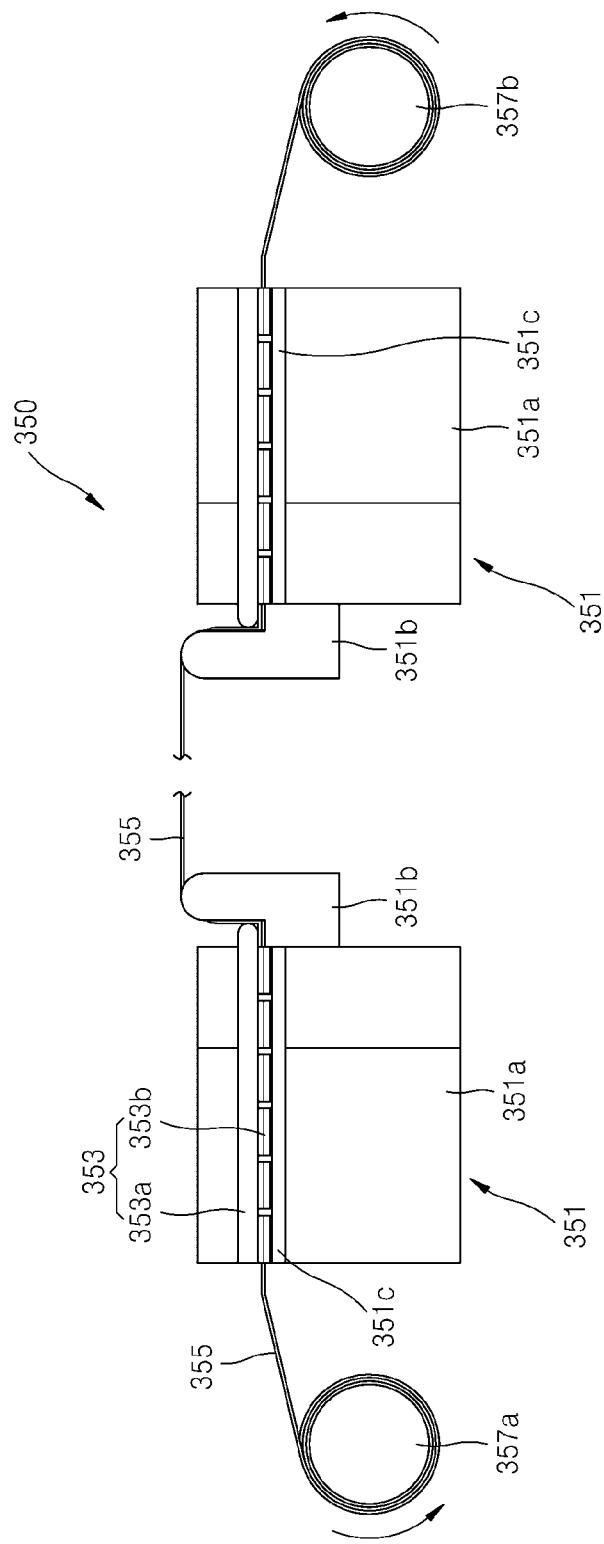
FIG. 12 is a schematic side view of a second nozzle assembly included in a thin film deposition apparatus according to another embodiment of the present invention.

FIG. 12 is a schematic side view of a second nozzle assembly 350 included in a thin film deposition apparatus 100 of FIG. 1 according to another embodiment of the present invention. The thin film deposition apparatus 100 uses the second nozzle assembly 350 instead of the second nozzle assembly 150. Accordingly, the other elements of the thin film deposition apparatus 100 according to the current embodiment will not be described again here.

Referring to FIG. 12, the second nozzle assembly 350 includes a plurality of second nozzle frames 351, a plurality of elastic units 353, and a plurality of strings 355. Each of the second nozzle frames 351 includes a body unit 351a, a string supporting unit 351b, and an elastic unit supporting unit 351c. Each of the elastic units 353 includes a frame 353a and a plurality of elastic bodies 353b combined with the frame 353a.

The second nozzle assembly 350 further includes first and second winding units 357a and 357b. As described above, since boron fiber, KEVLAR fiber, and carbon fiber cannot be molded using heat, their cut ends (i.e., cross sections) may have a round shape. In this case, the diameter of the plurality of strings 355 needs to be equal to a width of an area of a substrate (not shown), on which a thin film is not formed. Accordingly, when the thickness of the second nozzle assembly 350 is relatively large due to the diameter of the plurality of strings 355, a shadow zone formed on the substrate 160 decreases but a deposition material (not shown) that does not pass through the second nozzle assembly 350 is accumulated on the plurality of strings 355. Thus, over time, the diameter of the plurality of strings 355 continuously increases, thereby reducing the width of a film deposited on the substrate 160.

So as to overcome this problem, the second nozzle assembly 350 of the thin film deposition apparatus according to the current embodiment of the present invention further includes the first and second winding units 357a and 357b. That is, the strings 355 are not fixed by an additional fixing unit but are fixed by the first and second winding units 357a and 357b which are disposed at both ends of the plurality of strings 355. The strings 355 are unwound from the second winding unit 357b and are wound around the first winding unit 357a. Thus, a deposition material is not appreciably accumulated on the plurality of strings 355 while between the nozzle frames 351. In this case, it is possible to prevent the plurality of strings 355 from sagging by adjusting tension applied to the second winding unit 357b from which the plurality of strings 355 are unwound and tension applied to the first winding unit 357a around which the plurality of strings 355 are wound. As described above, according to the current embodiment of the present invention, it is possible to maintain a width of a pattern deposited on a substrate at a constant level.

Figure 13:
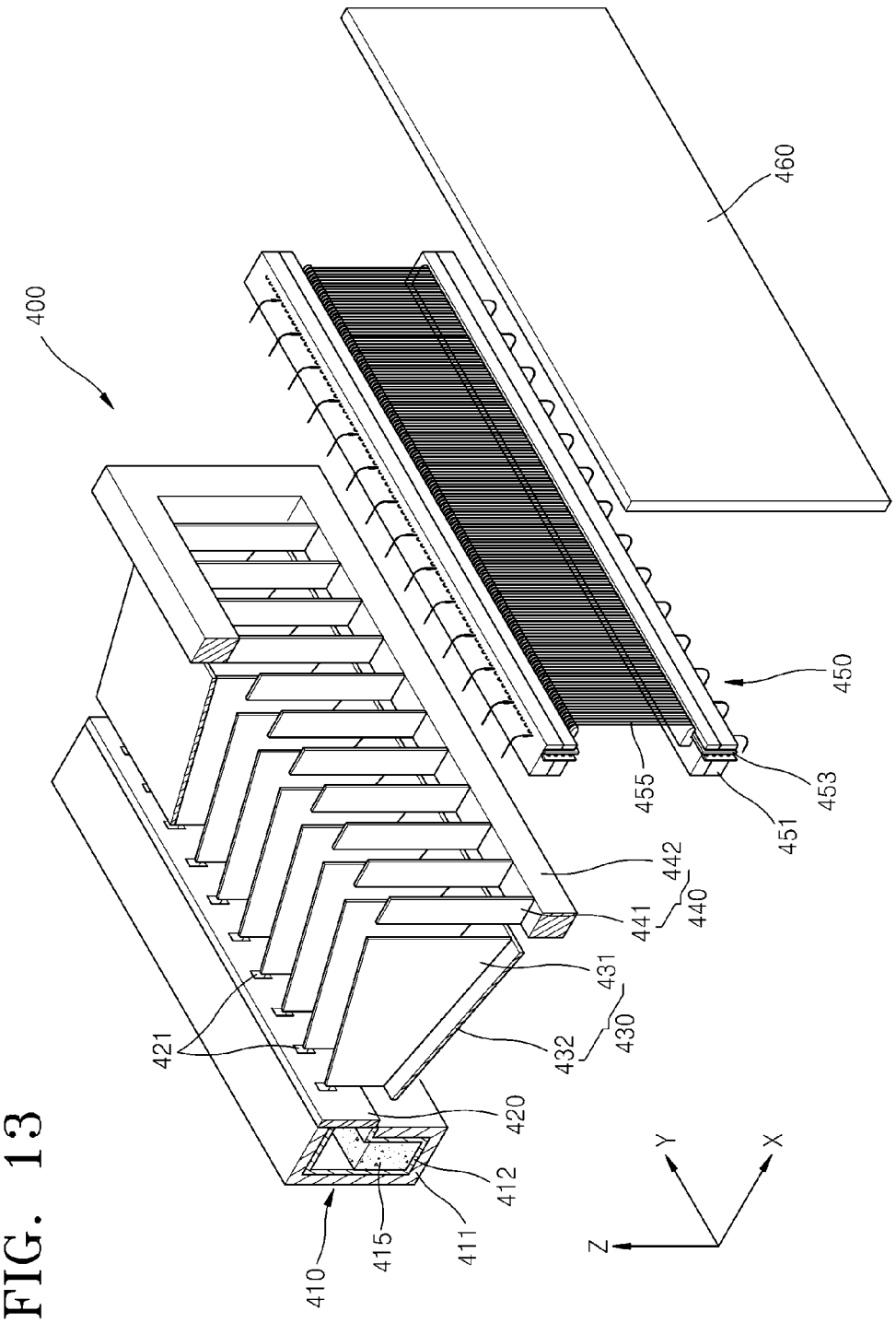
FIG. 13 is a schematic perspective view of a thin film deposition apparatus according to another embodiment of the present invention.

FIG. 13 is a schematic perspective view of a thin film deposition apparatus 400 according to another embodiment of the present invention. Referring to FIG. 13, the thin film deposition assembly 400 includes a deposition source 410, a first nozzle 420, a first barrier wall assembly 430, a second barrier wall assembly 440, a second nozzle assembly 450, and a substrate 460.

Although a chamber is not illustrated in FIG. 13 for convenience of explanation, all the components of the thin film deposition assembly 400 may be disposed within a chamber along with the substrate 460 that is maintained at an appropriate degree of vacuum. The chamber is maintained at an appropriate vacuum so as to allow a deposition material 415 to move straight.

The deposition material 415 is deposited on the substrate 460 while the substrate 460 is disposed in the chamber. The deposition source 410 contains and heats the deposition material 415. The deposition source 410 is disposed on a side of the chamber opposite to a side on which the substrate 460 is disposed. The deposition source 410 may include a crucible 411 and a heater 412 as shown, although the invention is not limited thereto.

The first nozzle 420 is disposed at a side of the deposition source 410. In particular, the first nozzle at the side of the deposition source 410 facing the substrate 460. The first nozzle 420 includes a plurality of first slits 421 arranged at equal intervals in a Y-axis direction.

The first barrier wall assembly 430 is disposed at a side of the first nozzle 420. The first barrier wall assembly 430 includes a plurality of first barrier walls 431, and a first barrier wall frame 432 that surrounds sides of the first barrier walls 431.

The second barrier wall assembly 440 is disposed at a side of the first barrier wall assembly 430 so as to be between the first barrier wall assembly 430 and the second nozzle assembly 450. The second barrier wall assembly 440 includes a plurality of second barrier walls 441, and a second barrier wall frame 444 that surrounds sides of the second barrier walls 441.

The second nozzle assembly 450 is disposed between the second barrier wall assembly 440 and the substrate 460. The second nozzle assembly 450 may be the same as the second nozzle assembly 150 of FIG. 1, the second nozzle assembly 250 of FIGS. 11A and 11B, or the second nozzle assembly 350 of FIG. 12.

The thin film deposition assembly 400 according to the current embodiment of the present invention includes two separate barrier wall assemblies (i.e., the first barrier wall assembly 430 and the second barrier wall assembly 440). However, it is understood that more than two barrier wall assemblies can be used, and that aspects of the invention do not require use of a barrier wall assembly.

In detail, the plurality of first barrier walls 431 may be arranged parallel to each other at equal intervals in the Y-axis direction. In addition, each of the first barrier walls 431 may be formed to extend along an XZ plane in FIG. 13, i.e., perpendicular to the Y-axis direction.

The second barrier walls 441 are arranged parallel to each other at equal intervals in the Y-axis direction. In addition, each of the first barrier walls 441 is formed to extend along an XZ plane in FIG. 13 (i.e., perpendicular to the Y-axis direction).

The first barrier walls 431 and the second barrier walls 431 partition the space between the first nozzle 420 and the second nozzle assembly 450. In the thin film deposition apparatus 400, the deposition space is divided by the first barrier walls 431 and the second barrier walls 441 into sub-deposition spaces that respectively correspond to the first slits 421 through which the deposition material 415 is discharged.

The second barrier walls 441 may be disposed to correspond respectively to the first barrier walls 431. In other words, the second barrier walls 441 may be respectively disposed to be parallel to and aligned with the first barrier walls 431. Each pair of the corresponding first and second barrier walls 431 and 441 may be located on the same plane. As described above, since the space between the first nozzle 420 and the second nozzle assembly 450, which will be described later, is partitioned by the first barrier walls 431 and the second barrier walls 441, which are disposed parallel to each other, the deposition material 415 discharged through one of the first slits 421 is not mixed with the deposition material 415 discharged through the other first slits 421, and is deposited on the substrate 460 through the second slits 450. In other words, the first barrier walls 431 and the second barrier walls 441 guide the deposition material 415, which is discharged through the first slits 421, not to flow in the Y-axis direction.

Although the first barrier walls 431 and the second barrier walls 441 are respectively illustrated as having the same thickness in the Y-axis direction, the present invention is not limited thereto. In other words, the second barrier walls 441, which need to be accurately aligned with the second nozzle assembly 450, may be formed to be relatively thin. In contrast, the first barrier walls 431, which do not need to be precisely aligned with the second nozzle assembly 450, may be formed to be relatively thick. This makes it easier to manufacture the thin film deposition apparatus 400. However, it is understood that the first and second barrier walls 431, 441 can have a same thickness in other aspects of the invention.

As described above, the thin film deposition apparatus according to the present invention may be easily manufactured and may be simply applied to manufacture a thin film on a large substrate on a mass scale. The thin film deposition apparatus may improve manufacturing yield and deposition efficiency and may allow deposition materials to be reused.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming a thin film on a target utilizing a thin film deposition apparatus, the target has a width W in a first direction, and a length L in a second direction perpendicular to the first direction, the method comprising:
    passing a deposition material from a deposition source through a plurality of first slits of a first nozzle, the plurality of first slits being spaced apart in the first direction;
    passing the deposition material from the first nozzle between a plurality of gaps defined by a plurality of strings of a second nozzle assembly disposed between the target and the first nozzle, the second nozzle assembly is separated from the target by a predetermined distance and includes a frame assembly having an opening across which the plurality of strings are stretched in the second direction, the opening has a second length in the second direction smaller than L; and
    inducing a relative motion between the second nozzle assembly and the target while the deposition material proceeds from the second nozzle assembly to be deposited on the target, and
    wherein the deposition material from the deposition source is patterned on the target by the second nozzle assembly and a thickness of each of the plurality of strings corresponds to a width of an area on the target in the second direction on which no thin film is to be formed.

2. The method of claim 1, further comprising:
    using an elastic unit which applies a predetermined elastic force to the plurality of strings to maintain the plurality of strings in tension.

3. The method of claim 1, further comprising, as the deposition material passes between the strings, moving the strings in the first direction.

4. The method of claim 3, wherein the moving the strings comprises unwinding the strings from an unwinding unit disposed at a first side of the frame assembly, passing the unwound strings through the frame assembly and across the opening, and winding the strings on a winding unit disposed on at a second side of the frame assembly.

5. The method of claim 1, wherein the plurality of strings comprise a glass fiber.

6. The method of claim 5, further comprising heating the glass fiber to a softening point and applying pressure thereto to shape the glass fiber to have a width the same as a width of an area on the target in the second direction on which no thin film is to be formed.

7. The method of claim 1, wherein the plurality of strings comprise a fiber selected from the group consisting of a boron fiber, an aramid or para-aramid fiber, and a carbon fiber.

8. The method of claim 1, further comprising:
    guiding the deposition material between the first nozzle and the second nozzle assembly using a plurality of sub-deposition spaces formed between a plurality of barrier walls of a barrier wall assembly.

9. The method of claim 1, wherein the second nozzle assembly is disposed apart from the target by the predetermined distance that is constant in a third direction normal to a plane defined by the first direction and the second direction through the entire second nozzle assembly along the first direction.

10. The method of claim 1, wherein the deposition material discharged from the deposition source passes between gaps between each adjacent pair of the strings.

11. The method of claim 1, wherein:
    the second nozzle assembly comprises a pair of second nozzle frames; and
    the plurality of strings are disposed between the pair of second nozzle frames.

12. The method of claim 11, wherein the second nozzle assembly further comprises an elastic unit disposed between the pair of second nozzle frames which applies a predetermined elastic force to the plurality of strings to maintain the plurality of strings in tension.

13. The method of claim 12, wherein the elastic unit comprises a tension spring.

14. The method of claim 11, wherein each of the second nozzle frames comprises a plurality of string accommodating grooves in which the strings are accommodated and having a shape matching respective cut ends of the plurality of strings.

15. The method of claim 11, wherein the second nozzle assembly further comprises a plurality of fixing units, each of the fixing units being combined with at least one of end of the plurality of strings to prevent the plurality of strings from being separated from the second nozzle frames.

16. The method of claim 11, wherein each of the second nozzle frames comprises a plurality of string through-holes through which the corresponding plurality of strings extend.

17. The method of claim 16, wherein each of the plurality of strings is inserted to pass through one of the plurality of string through-holes, is bent, and is then inserted again to pass through an adjacent one of the plurality of string through-holes.

18. The method of claim 11, wherein the second nozzle assembly further comprises a pair of winding units, each winding unit being disposed at one of the second nozzle frames such that the strings are unwound from one of the winding units, pass through the second nozzle frames, and are wound around the other winding unit.

19. The method of claim 18, wherein the winding units rotate in the same direction to move the plurality of strings through the second nozzle frames.

20. A method of forming a thin film on a target, the method comprising:
    passing a deposition material from a deposition source through first slits of a first nozzle, first slits being arranged in a first direction;
    passing the deposition material from the first nozzle between strings of a second nozzle assembly disposed between the target and the first nozzle, the second nozzle assembly including a frame assembly having an opening across which the strings are stretched in a second direction crossing the first direction; and
    inducing a relative motion between the second nozzle assembly and the target while the deposition material proceeds from the second nozzle assembly to be deposited on the target, wherein:

the second nozzle assembly comprises a pair of second nozzle frames;

the strings are disposed between the pair of second nozzle frames;

each of the second nozzle frames comprises an upper second nozzle frame and a lower second nozzle frame;

the upper second nozzle frame and the lower second nozzle frame comprise a plurality of string through-holes through which the plurality of strings pass, the strings are alternately inserted from the upper second nozzle frame into the lower second nozzle frame and from the lower second nozzle frame into the upper second nozzle frame so as to pass through the plurality of string through-holes.

21. The method of claim 20, further comprising a plurality of tightening units disposed at both ends of the upper and lower second nozzle frames, wherein the plurality of tightening units include pairs of bolts and nuts.

22. The method of claim 8, wherein each of the barrier walls extends in a third direction that is substantially perpendicular to the first direction and the second direction, so as to partition the space between the first nozzle and the second nozzle assembly into a plurality of sub-deposition spaces.

23. The method of claim 8, wherein the plurality of barrier walls are arranged at equal intervals.

24. The method of claim 8, wherein the plurality of barrier walls are disposed apart from the second nozzle assembly by a predetermined distance.

25. The method of claim 8, wherein the barrier wall assembly is detachable from the thin film deposition apparatus.

26. The method of claim 8, wherein the barrier wall assembly comprises:
    a first barrier wall assembly including a plurality of first barrier walls; and
    a second barrier wall assembly including a plurality of second barrier walls.

27. The method of claim 26, wherein each of the plurality of first barrier walls and each of the plurality of second barrier walls extend in a third direction that is substantially perpendicular to the first direction and the second direction, so as to partition the space between the first nozzle and the second nozzle assembly into a plurality of sub-deposition spaces.

28. The method of claim 26, wherein the plurality of first barrier walls are arranged to respectively correspond to the plurality of second barrier walls to form a plurality of pairs of the corresponding first and second barrier walls.

29. The method of claim 28, wherein each pair of the corresponding first and second barrier walls are substantially coplanar.

30. The method of claim 1, wherein the deposition material is deposited on the target while the deposition source, the first nozzle, and the second nozzle assembly are moved relative to the target or while the target is moved relative to the deposition source, the first nozzle, and the second nozzle assembly.

31. The method of claim 1, wherein the deposition source, the first nozzle, and the second nozzle assembly are moved relative to the target along a plane parallel to a surface of the target or the target is moved relative to the deposition source, the first nozzle, and the second nozzle assembly along the second direction.

* * * * *